United States Patent  (10) Patent No.: US 12,040,323 B2
Umemoto et al.  (45) Date of Patent: Jul. 16, 2024

(54) SEMICONDUCTOR DEVICE

(71) Applicant: Murata Manufacturing Co., Ltd., Kyoto-fu (JP)

(72) Inventors: Yasunari Umemoto, Nagaokakyo (JP); Shaojun Ma, Nagaokakyo (JP); Shigeki Koya, Nagaokakyo (JP); Kenji Sasaki, Nagaokakyo (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 454 days.

(21) Appl. No.: 17/394,252

(22) Filed: Aug. 4, 2021

(65) Prior Publication Data

US 2022/0059527 A1 Feb. 24, 2022

(30) Foreign Application Priority Data

Aug. 24, 2020 (JP) .................. 2020-140686

(51) Int. Cl.
H01L 27/06 (2006.01)
H01L 29/737 (2006.01)
H03F 3/19 (2006.01)
H03F 3/21 (2006.01)

(52) U.S. Cl.
CPC ........ H01L 27/0647 (2013.01); H01L 29/737 (2013.01); H03F 3/19 (2013.01); H03F 3/21 (2013.01)

(58) Field of Classification Search
CPC ............... H01L 27/0647; H01L 29/737; H01L 27/0658; H01L 29/7371; H01L 27/082; H03F 3/19; H03F 3/21; H03F 3/195; H03F 3/213

See application file for complete search history.

(56) References Cited

U.S. PATENT DOCUMENTS

2002/0058375 A1* 5/2002 Kurokawa ............. H01L 29/73
  257/E29.174
2004/0065900 A1* 4/2004 Umemoto ........... H01L 29/7371
  257/E29.189
2006/0138459 A1* 6/2006 Kurokawa ........ H01L 29/42304
  257/E29.189
2017/0359030 A1* 12/2017 Obu ...................... H03F 1/0238

(Continued)

FOREIGN PATENT DOCUMENTS

JP 2005-101402 A 4/2005
JP 2006-185990 A 7/2006

Primary Examiner — S M Sohel Imtiaz
(74) Attorney, Agent, or Firm — Studebaker & Brackett PC

(57) ABSTRACT

Each of cells arranged on a substrate surface along a first direction includes at least one unit transistor. Collector electrodes are arranged between two adjacent cells. A first cell, which is at least one of the cells, includes unit transistors arranged along the first direction. The unit transistors are connected in parallel to each another. In the first cell, the base electrode and the emitter electrode in each unit transistor are arranged along the first direction, and the order of arrangement of the base electrode and the emitter electrode is the same among the unit transistors. When looking at one first cell, a maximum value of distances in the first direction between the emitter electrodes of two adjacent unit transistors in the first cell being looked at is shorter than ½ of a shorter one of distances between the first cell being looked at and adjacent cells.

20 Claims, 18 Drawing Sheets

(56) References Cited

U.S. PATENT DOCUMENTS

2018/0269206 A1* 9/2018 Obu .................... H01L 21/8252
2019/0198464 A1* 6/2019 Tsutsui .................... H01L 24/14
2019/0214382 A1* 7/2019 Koya .................. H01L 29/0692

* cited by examiner

SEMICONDUCTOR DEVICE

CROSS-REFERENCE TO RELATED APPLICATION

This application claims benefit of priority to Japanese Patent Application No. 2020-140686, filed Aug. 24, 2020, the entire content of which is incorporated herein by reference.

BACKGROUND

Technical Field

The present disclosure relates to semiconductor devices.

Background Art

As a transistor that constitutes a power amplifier module of a mobile communication device, for example, a heterojunction type bipolar transistor (HBT) is used. Based on an envelope curve of waveform of an input signal, a high collector voltage is applied to a bipolar transistor used in an amplifier circuit employing an envelope tracking (ET) system, which is drawing attention in recent years. As the fifth generation mobile communication system (5G) becomes more common, there is a pronounced tendency among power amplifiers to have higher output power.

To introduce the ET system and achieve higher output power of a power amplifier, there is a need to operate a bipolar transistor at a higher voltage. Even under a condition with a higher collector voltage, there is a need to hinder breakdown due to load change. Japanese Unexamined Patent Application Publication Nos. 2005-101402 and 2006-185990 disclose HBTs with improved thermal stability.

SUMMARY

Although prior art HBTs with improved thermal stability can suppress a unstable operation called thermal runaway, it cannot be said that such HBTs have a sufficient breakdown tolerance (load change breakdown tolerance) at the time of load change under the condition of high collector voltage. It is desirable to further improve the load change breakdown tolerance under the condition of high collector voltage.

Therefore, the present disclosure provides a semiconductor device that enables improvement of the load change breakdown tolerance.

According to preferred embodiments of the present disclosure, there is provided a semiconductor device including a substrate; a plurality of transistor cells arranged side by side along a first direction on a surface of the substrate, each of the plurality of transistor cells including at least one unit transistor; and a collector electrode arranged between two of the plurality of transistor cells adjacent to one another. A first transistor cell includes a plurality of unit transistors arranged side by side along the first direction, with at least one of the plurality of transistor cells being the first transistor cell. The plurality of unit transistors are connected in parallel to one another. Each of the plurality of unit transistors includes a collector layer, a base layer arranged on the collector layer, an emitter layer arranged on the base layer, a base electrode electrically connected to the base layer, and an emitter electrode electrically connected to the emitter layer. The collector electrode is electrically connected to the collector layer of the unit transistor included in the transistor cell adjacent to the collector electrode in the first direction, and in the first transistor cell, the base electrode and the emitter electrode in each of the plurality of unit transistors are arranged side by side along the first direction. An order of arrangement of the base electrode and the emitter electrode is same among the plurality of unit transistors, and when looking at one of the first transistor cells, a maximum value of emitter electrode pitches is shorter than ½ of a shorter cell pitch, with the emitter electrode pitch being a distance in the first direction between the emitter electrodes of two unit transistors adjacent to one another in the first transistor cell being looked at, and the shorter cell pitch being a shorter one of cell pitches that are specific distances in the first direction between the transistor cell being looked at and the transistor cells adjacent to the transistor cell being looked at.

By setting the emitter electrode pitch and the cell pitch as described above, a thermal influence among the plurality of unit transistors in one of the first transistor cells increases, and thus the temperature of the collector layer is likely to increase. Because of this, when a collector current increases instantaneously due to load change, the ionization rate due to impact ionization decreases, and the creation of electron-hole pairs is suppressed. As a result, a further increase in the collector current is suppressed, and the advantageous effect of improving the breakdown tolerance at the time of load change is obtained.

Other features, elements, characteristics and advantages of the present disclosure will become more apparent from the following detailed description of preferred embodiments of the present disclosure with reference to the attached drawings.

DETAILED DESCRIPTION

First Working Example

Figure 1:
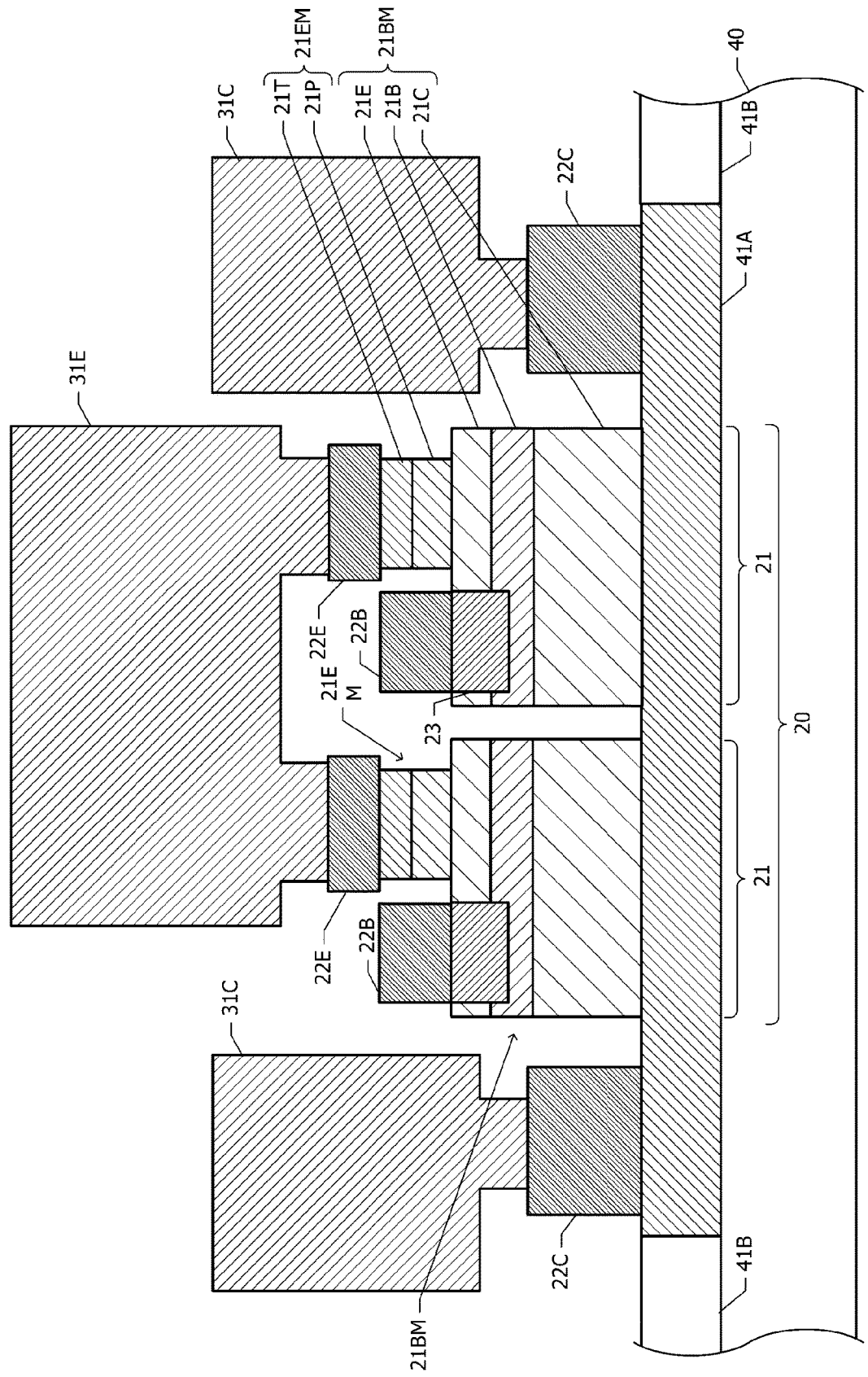
FIG. 1 is a cross-sectional view of a single transistor cell of a semiconductor device according to a first working example.

Referring to FIG. 1 to FIG. 4, a semiconductor device according to the first working example is described. FIG. 1 is a cross-sectional view of a single transistor cell 20 of a semiconductor device according to the first working example. A semiconductor layer is epitaxially grown on a substrate 40 composed of a semiconductor. Part of this semiconductor layer forms a sub-collector layer 41A having n-type conductivity, and the remaining part of this semiconductor layer forms a device isolation region 41B insulated by implanting impurity. Two base mesas 21BM are arranged on the sub-collector layer 41A. The base mesa 21BM includes a collector layer 21C composed of a n-type semiconductor, a base layer 21B composed of a p-type semiconductor arranged on the collector layer 21C, and an emitter layer 21E composed of a n-type semiconductor arranged on the base layer 21B. The collector layer 21C, the base layer 21B, and the emitter layer 21E form an HBT.

An emitter mesa 21EM is arranged on part of the region of the base mesa 21BM. The emitter mesa 21EM includes a cap layer 21P composed of a n-type semiconductor and a contact layer 21T composed of a n-type semiconductor arranged on the cap layer 21P.

A base electrode 22B is arranged on a region of the top surface of the base mesa 21BM, where the emitter mesa 21EM is not arranged. The base electrode 22B is electrically connected to the base layer 21B via an alloying region 23 that penetrates the emitter layer 21E and reaches the base layer 21B. Alternatively, part of the base layer 21B may be exposed by removing part of the emitter layer 21E, and an ohmic contact may be formed directly between the exposed base layer 21B and the base electrode 22B. An emitter electrode 22E is arranged on the emitter mesa 21EM. The emitter electrode 22E is electrically connected to the emitter layer 21E via the contact layer 21T and the cap layer 21P.

The emitter electrode 22E overhangs in a lateral direction (direction orthogonal to the thickness direction of the substrate 40) from an edge portion of the emitter mesa 21EM. The overhanging structure of the emitter electrode 22E is formed, for example, by self-alignment process.

Collector electrodes 22C are arranged on the sub-collector layer 41A on both sides of the region where the two base mesas 21BM are arranged. The collector electrode 22C is electrically connected to the collector layer 21C via the sub-collector layer 41A. One of the collector electrodes 22C, the two base mesas 21BM, and the other collector electrode 22C are arranged side by side in one direction.

The base mesa 21BM, the emitter mesa 21EM, the emitter electrode 22E, and the base electrode 22B are included in a unit transistor 21. A single transistor cell 20 includes two unit transistors 21.

An emitter wiring line 31E of the first layer is arranged on two emitter electrodes 22E. The emitter wiring line 31E is electrically connected to the two emitter electrodes 22E. A collector wiring line 31C of the first layer is arranged on each of two collector electrodes 22C. The collector wiring lines 31C are electrically connected to the corresponding collector electrodes 22C directly below, respectively. Interlayer insulation films such as SiN or the like (not illustrated in FIG. 3) are arranged between metal wiring lines of the first layer such as the emitter wiring line 31E, the collector wiring lines 31C, and the like and electrodes such as the emitter electrodes 22E, the base electrodes 22B, and the collector electrodes 22C. The emitter electrode 22E and the emitter wiring line 31E are connected to each other through an opening formed in this interlayer insulation film, and the collector electrode 22C and the collector wiring line 31C are connected to each other through an opening formed in this interlayer insulation film.

Next, exemplary materials and thicknesses of respective semiconductor layers in the substrate 40, the sub-collector layer 41A, and the unit transistor 21 are described. As the substrate 40, a semi-insulating GaAs is used. For the sub-collector layer 41A, n-type GaAs in which the doping concentration (dopant concentration) of Si is greater than or equal to about $2 \times 10^{18}$ cm$^{-3}$ and less than or equal to about $4 \times 10^{18}$ cm$^{-3}$ (i.e., from about $2 \times 10^{18}$ cm$^{-3}$ to about $4 \times 10^{18}$ cm$^{-3}$) is used, and the thickness of the sub-collector layer 41A is greater than or equal to about 400 nm and less than or equal to about 1000 nm (i.e., from about 400 nm to about 1000 nm). As the dopant, instead of Si, Te may be used. The device isolation region 41B is formed by implanting ions of B, O, or He into a n-type GaAs layer for insulation.

For the collector layer 21C, Si-doped n-type GaAs is used, and the thickness of the collector layer 21C is greater than or equal to about 500 nm and less than or equal to about 2000 nm (i.e., from about 500 nm to about 2000 nm). The doping concentration of Si varies along the thickness direction. In the shallowest region, the doping concentration is an order of about $10^{15}$ cm$^{-3}$ or about $10^{16}$ cm$^{-3}$, and in the deepest region, the doping concentration is an order of about $10^{18}$ cm$^{-3}$.

For the base layer 21B, p-type GaAs, InGaAs, GaInAsN, GaAsSb, or the like is used, and the doping concentration of C is greater than or equal to about $1\times10^{19}$ cm$^{-3}$ and less than or equal to about $5\times10^{19}$ cm$^{-3}$ (i.e., from about $1\times10^{19}$ cm$^{-3}$ to about $5\times10^{19}$ cm$^{-3}$). the thickness of the base layer 21B is greater than or equal to about 50 nm and less than or equal to about 150 nm (i.e., from about 50 nm to about 150 nm). The sheet resistance of the base layer 21B is greater than or equal to about 130 Ω/sq and less than or equal to about 400 Ω/sq (i.e., from about 130 Ω/sq to about 400 Ω/sq).

For the emitter layer 21E, n-type InGaP in which the doping concentration of Si is greater than or equal to about $2\times10^{17}$ cm$^{-3}$ and less than or equal to about $5\times10^{17}$ cm$^{-3}$ is used (i.e., from about $2\times10^{17}$ cm$^{-3}$ to about $5\times10^{17}$ cm$^{-3}$), and the thickness of the emitter layer 21E is greater than or equal to about 20 nm and less than or equal to about 50 nm (i.e., from about 20 nm to about 50 nm). For the cap layer 21P, n-type GaAs in which the doping concentration of Si is greater than or equal to about $2\times10^{18}$ cm$^{-3}$ and less than or equal to about $4\times10^{18}$ cm$^{-3}$ (i.e., from about $2\times10^{18}$ cm$^{-3}$ to about $4\times10^{18}$ cm$^{-3}$) is used, and the thickness of the cap layer 21P is greater than or equal to about 50 nm and less than or equal to about 200 nm (i.e., from about 50 nm to about 200 nm). For the contact layer 21T, n-type InGaAs in which the doping concentration of Si is greater than or equal to about $1\times10^{19}$ cm$^{-3}$ and less than or equal to about $3\times10^{19}$ cm$^{-3}$ (i.e., from about $1\times10^{19}$ cm$^{-3}$ to about $3\times10^{19}$ cm$^{-3}$) is used, and the thickness of the contact layer 21T is greater than or equal to about 100 nm and less than or equal to about 200 nm (i.e., from about 100 nm to about 200 nm).

Each of the sub-collector layer 41A, the collector layer 21C, the base layer 21B, and the emitter layer 21E may alternatively include a plurality of layers having different semiconductor materials or different composition ratios depending on the role and function thereof.

Figure 2:
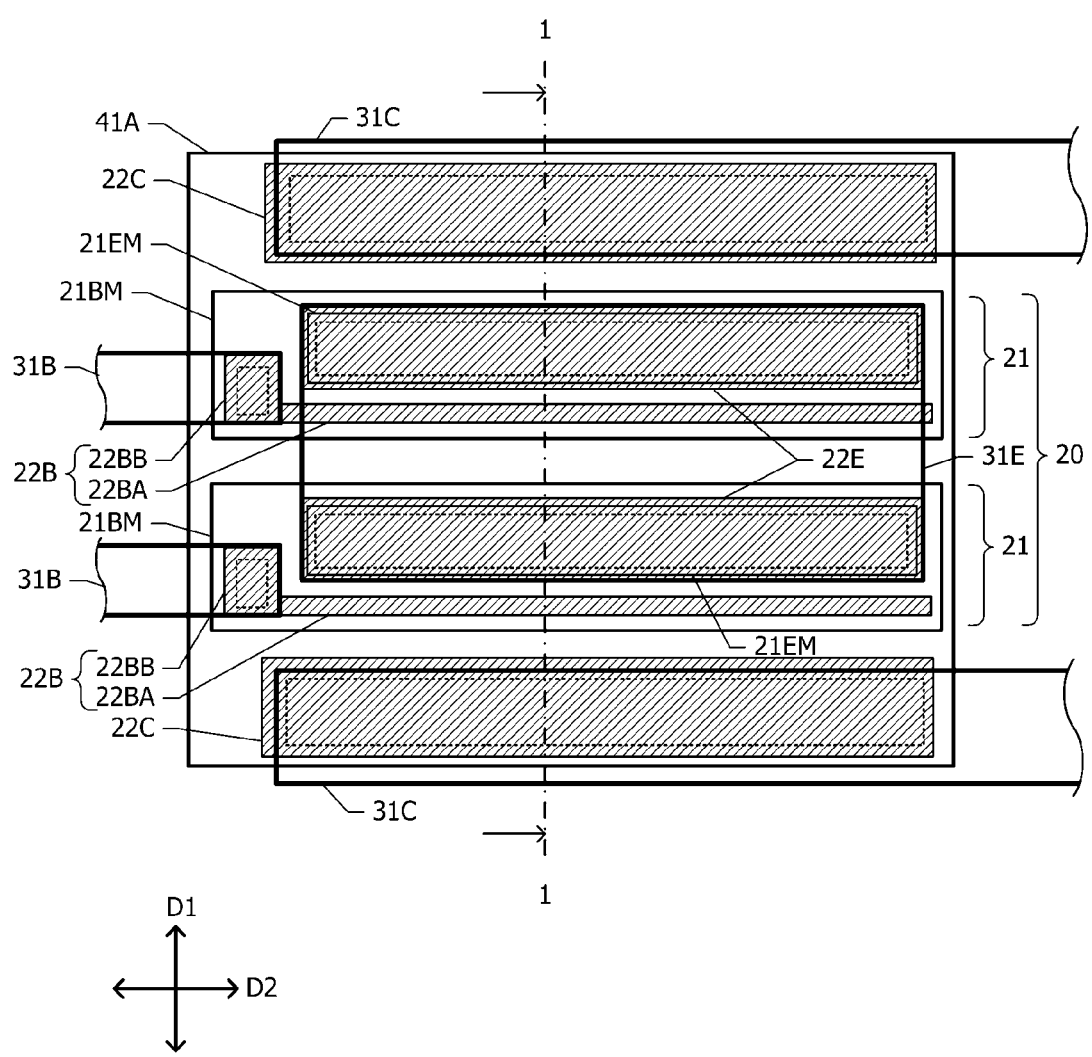
FIG. 2 is a diagram illustrating a planar spatial relationship among constituent elements of a single transistor cell of the semiconductor device according to the first working example.

FIG. 2 is a diagram illustrating a planar spatial relationship among constituent elements of the single transistor cell 20 of the semiconductor device according to the first working example. A cross-sectional view at the dashed-dotted line 1-1 of FIG. 2 corresponds to FIG. 1. In FIG. 2, hatching is applied to the emitter electrode 22E, the base electrode 22B, and the collector electrode 22C.

Two base mesas 21BM are arranged side by side along a first direction D1 in the inside of the sub-collector layer 41A having a substantially rectangular shape. Each of the base mesas 21BM has a shape elongated in a second direction D2 that is orthogonal to the first direction D1. The emitter mesa 21EM is arranged in the inside of each base mesa 21BM. The emitter mesa 21EM also has a shape elongated in the second direction D2 and is arranged at an off-center position shifted in the first direction D1 relative to the base mesa 21BM.

Figure 3:
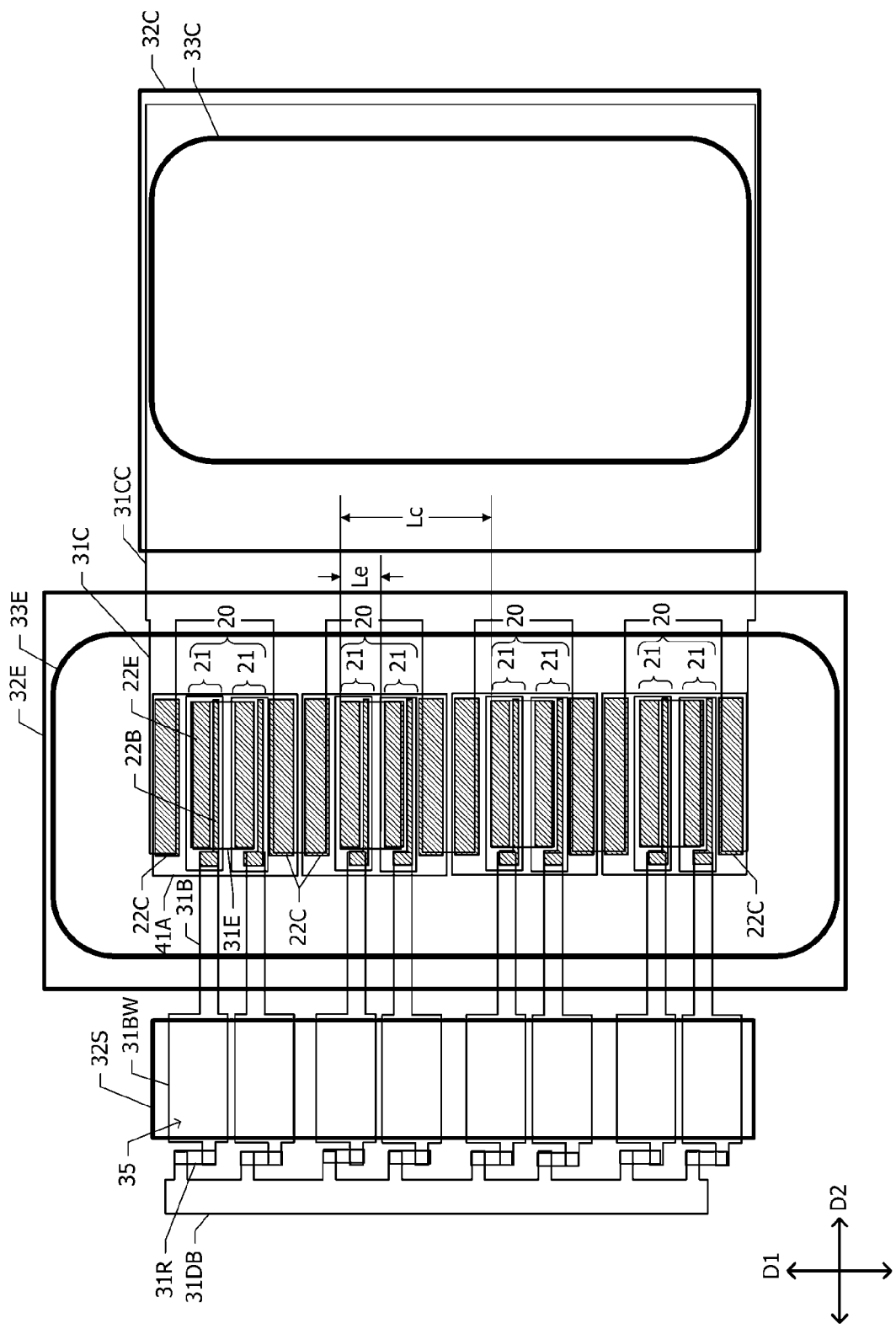
FIG. 3 is a diagram illustrating a planar spatial relationship among constituent elements of the semiconductor device according to the first working example.

The emitter electrode 22E is arranged in such a manner as to substantially overlap the emitter mesa 21EM, and as is the case with the emitter mesa 21EM, the emitter electrode 22E also has a shape elongated in the second direction D2. As illustrated in FIG. 3, the emitter electrode 22E expands slightly beyond an edge part of the emitter mesa 21EM. In the plan view, two emitter electrodes 22E have substantially the same shape and dimension.

The base electrode 22B is arranged in the inside of the base mesa 21BM but the outside of the emitter mesa 21EM. The base electrode 22B includes a main part 22BA elongated in the second direction D2 and a contact part 22BB to which one end portion of the main part 22BA is connected. In the plan view, two base electrodes 22B have substantially the same shape and dimension. The main part 21BA of the base electrode 22B and the emitter electrode 22E in each of the unit transistors 21 are arranged side by side along the first direction D1, and the order of arrangement of the main part 21BA of the base electrode 22B and the emitter electrode 22E is the same between the two unit transistors 21.

In the second direction D2, a range where the emitter electrode 22E is arranged is included in a range where the main part 22BA of the base electrode 22B is arranged. In the second direction D2, the contact part 22BB of the base electrode 22B is arranged in the outside of the range where the emitter electrode 22E is arranged.

The two base mesas 21BM corresponding to the two unit transistors 21 are separated from each other with a gap therebetween in the first direction D1. Because of this, the emitter layer 21E, the base layer 21B, and the collector layer 21C (FIG. 1) of one of the unit transistors 21 are also separated from the emitter layer 21E, the base layer 21B, and the collector layer 21C of the other unit transistor 21, respectively.

The emitter wiring line 31E of the first layer overlaps the two emitter electrodes 22E and connects the two emitter electrodes 22E to each other. In FIG. 2, an opening formed in the interlayer insulation film arranged between the emitter electrode 22E and the emitter wiring line 31E is illustrated by dashed line. Similarly, in regions where the collector electrode 22C and the base electrode 22B are arranged, openings formed in the interlayer insulation film are illustrated by dashed line.

The two collector electrodes 22C are arranged at positions that sandwich the two unit transistors 21 in the first direction D1. Each of the collector electrodes 22C has a shape elongated in the second direction D2. Two collector wiring lines 31C partially overlap the two collector electrodes 22C, respectively. The collector wiring lines 31C extend toward one side of the second direction D2 (right side in FIG. 2) to the outside of the sub-collector layer 41A.

Two base wiring lines 31B of the first layer are connected to the contact parts 22BB of the two base electrodes 22B, respectively. The base wiring lines 31B extend from the contact part 22BB toward one side of the second direction D2 (left side in FIG. 2) to the outside of the sub-collector layer 41A.

Next, exemplary dimensions of the respective constituent elements in the plan view are described. Dimensions (widths) of the emitter mesa 21EM and the emitter electrode 22E in the first direction D1 are greater than or equal to about 1 μm and less than or equal to about 8 μm (i.e., from about 1 μm to about 8 μm), and dimensions (lengths) of the emitter mesa 21EM and the emitter electrode 22E in the second direction D2 are greater than or equal to about 5 μm and less than or equal to about 60 μm (i.e., from about 5 μm to about 60 μm). The dimension (width) of the main part 22BA of the base electrode 22B in the first direction D1 is greater than or equal to about 0.5 μm and less than or equal to about 1.5 μm (i.e., from about 0.5 μm to about 1.5 μm). The gap between the emitter electrode 22E and the main part 22BA of the base electrode 22B is greater than or equal to about 0.5 μm and less than or equal to about 1.5 μm (i.e., from about 0.5 μm to about 1.5 μm). The gap between the two base mesas 21BM is greater than or equal to about 5 μm and less than or equal to about 10 μm (i.e., from about 5 μm to about 10 μm). The gap between the two emitter electrodes 22E in the transistor cell 20 is greater than or equal to about 6 μm and less than or equal to about 12 μm (i.e., from about 6 μm to about 12 μm).

FIG. 3 is a diagram illustrating a planar spatial relationship among constituent elements of the semiconductor device according to the first working example. As is the case with FIG. 2, in FIG. 3, hatching is applied to the emitter electrode 22E, the base electrode 22B, and the collector electrode 22C. Four transistor cells 20 are arranged side by side along the first direction D1. Note that the number of the transistor cells 20 is not limited to four and may be two, three, five, or more.

In the plan view, shapes and dimensions of the emitter electrodes 22E of the unit transistors 21 included in a plurality of the transistor cells 20 are all substantially the same. Furthermore, in the plan view, shapes and dimensions of the base electrodes 22B of the unit transistors 21 included in the plurality of the transistor cells 20 are all substantially the same. The order of arrangement of the base electrode 22B and the emitter electrode 22E in the unit transistor 21 along the first direction D1 is the same among the plurality of the transistor cells 20.

Two collector electrodes 22C are arranged between the transistor cells 20 adjacent to each other. One of the collector electrodes 22C is arranged within the sub-collector layer 41A that includes one of the transistor cells 20, and the other collector electrode 22C is arranged within the sub-collector layer 41A that includes the other transistor cell 20. The collector electrode 22C is arranged in the outer side of each of the transistor cells 20 arranged at both ends in the first direction D1. The collector electrode 22C is electrically connected to the collector layer 21C (FIG. 1) of the unit transistor 21 included in the transistor cell 20 adjacent to the collector electrode 22C in the first direction D1.

The collector wiring line 31C of the first layer extends toward one side of the second direction D2 from the collector electrode 22C. The collector wiring line 31C extending from two collector electrodes 22C arranged between the transistor cells 20 adjacent to each other forms a single wiring line.

A collector common wiring line 31CC of the first layer is arranged on one side of a cell row where the plurality of the transistor cells 20 are arranged side by side. A plurality of the collector wiring lines 31C is connected to the collector common wiring line 31CC. The collector common wiring line 31CC is arranged in a metal wiring layer of the first layer, which is the same layer with the collector wiring lines 31C.

A collector wiring line 32C of the second layer is arranged in such a manner as to overlap the collector common wiring line 31CC. The collector wiring line 32C of the second layer is connected to the collector common wiring line 31CC of the first layer through an opening formed in the interlayer insulation film arranged below the collector wiring line 32C of the second layer. A collector bump 33C is arranged in such a manner as to overlap the collector wiring line 32C of the second layer. The collector bump 33C is connected to the collector wiring line 32C of the second layer through an opening formed in a protective film arranged below the collector bump 33C.

An emitter wiring line 32E of the second layer is arranged in such a manner as to include, in the plan view, a plurality of the emitter wiring lines 31E of the first layer that corresponds to the plurality of the transistor cells 20. The emitter wiring line 32E of the second layer is connected to the plurality of the emitter wiring lines 31E of the first layer through an opening formed in the interlayer insulation film arranged below the emitter wiring line 32E of the second layer. An emitter bump 33E is arranged in such a manner as to overlap the emitter wiring line 32E of the second layer. The emitter bump 33E is connected to the emitter wiring line 32E of the second layer through an opening formed in a protective film arranged below the emitter bump 33E.

A plurality of the base wiring lines 31B extending from the respective unit transistors 21 in the second direction D2 reach the outside of the emitter wiring line 32E of the second layer, and top portions of the plurality of the base wiring lines 31B are connected to a common DC bias input wiring line 31DB via resistive elements 31R, respectively. The base wiring line 31B includes an expansion part 31BW where the width of the base wiring line 31B is widened at an intermediate position. A common radio frequency signal input wiring line 32S overlaps the expansion parts 31BW of the plurality of the base wiring lines 31B. Capacitive elements 35 are each formed at a part where each of the plurality of the expansion parts 31BW overlaps the radio frequency signal input wiring line 32S.

A distance between two emitter electrodes 22E in a single transistor cell 20 in the first direction D1 is defined as an emitter electrode pitch Le. As the emitter electrode pitch Le, the distance between mutually corresponding positions of the two emitter electrodes 22E such as, for example, the distance in the first direction D1 between edge portions of the two emitter electrodes 22E on the same side extending in the second direction D2, the distance between geometric centers of the two emitter electrodes 22E in the first direction D1, or the like may be employed. The emitter electrode pitch Le is substantially the same among the plurality of the transistor cells 20.

A specific distance (description regarding the specific distance will be provided below) of adjacent transistor cells 20 in the first direction D1 is defined as a cell pitch Lc. As the cell pitch Lc (specific distance), the distance between mutually corresponding positions of the two transistor cells 20 in the first direction D1 such as, for example, the distance in the first direction D1 between edge portions of mutually corresponding emitter electrodes 22E of the two transistor cells 20, which are on the same side and extend in the second direction D2, the distance in the first direction D1 between geometric centers of pluralities of the emitter electrodes 22E of the respective transistor cells 20, or the like may be employed. The cell pitches Lc of adjacent two transistor cells 20 are substantially the same. That is to say, the plurality of the transistor cells 20 is arranged along the first direction D1 with a substantially equal pitch.

When looking at one of the transistor cells 20, the emitter electrode pitch Le of the emitter electrodes 22E of the transistor cell 20 being looked at is shorter than about ½ of the cell pitch Lc between the transistor cell 20 being looked at and the transistor cell 20 adjacent thereto.

Figure 4:
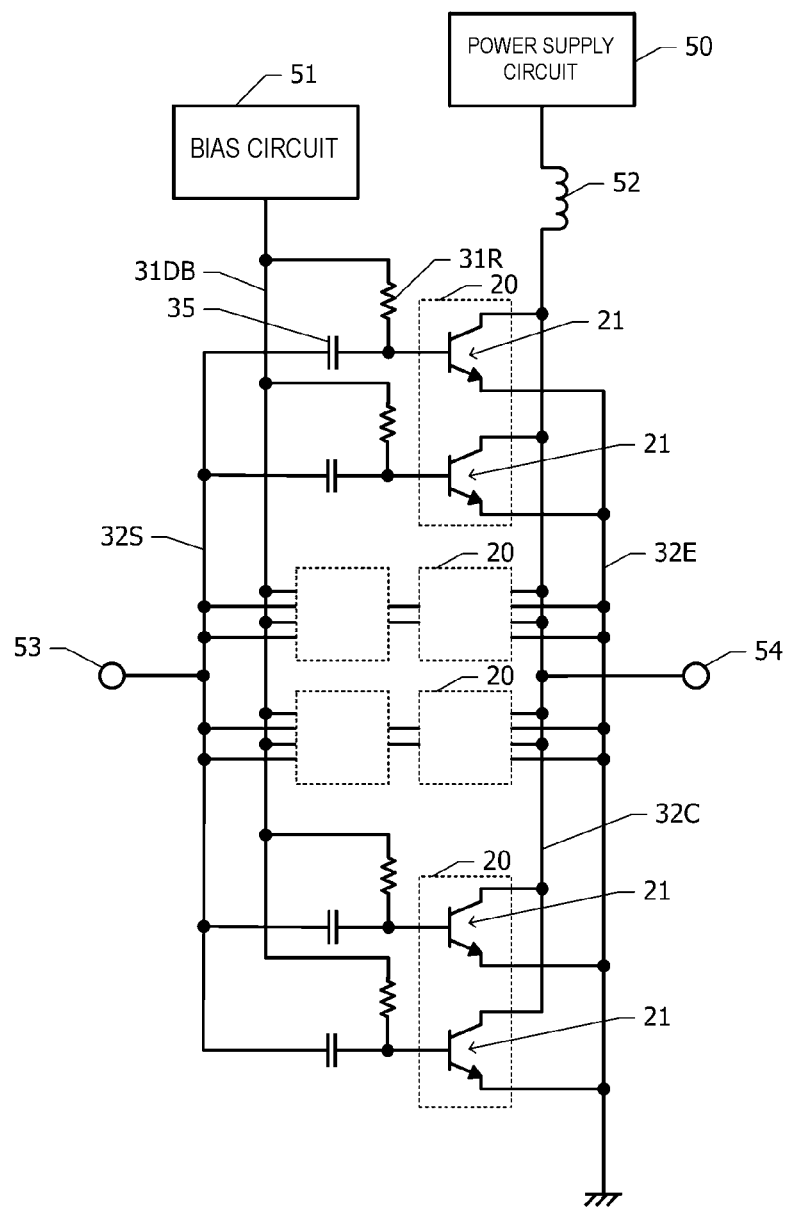
FIG. 4 is an equivalent circuit diagram of a semiconductor device according to the first working example.

FIG. 4 is an equivalent circuit diagram of a semiconductor device according to the first working example. Each of a plurality of the transistor cells 20 includes two unit transistors 21. A plurality of the unit transistors 21 are connected in parallel to each other. In some cases, a semiconductor device in which a plurality of hetero junction bipolar transistors (HBTs) are connected in parallel is referred to as a multifinger HBT. Specifically, the emitters of the plurality of the unit transistors 21 are connected to the common emitter wiring lines 32E, and the collectors of the plurality of the unit transistors 21 are connected to the common collector wiring lines 32C.

The base of each of the plurality of the unit transistors 21 is connected to the common DC bias input wiring line 31DB via the resistive element 31R. A base bias is supplied to the base of the unit transistor 21 from a bias circuit 51 via the DC bias input wiring line 31DB and the resistive element 31R. The base of each of the plurality of the unit transistors 21 is also connected to the common radio frequency signal input wiring line 32S via the capacitive element 35. A radio frequency signal is input to the base of the unit transistor 21 from a radio frequency signal input port 53 via the radio frequency signal input wiring line 32S and the capacitive element 35.

A power supply voltage is supplied to the collectors of the plurality of the unit transistors 21 from a power supply circuit 50 via an inductor 52 and the collector wiring lines 32C. The power supply circuit 50 is, for example, a power supply circuit employing an envelope tracking system and applies, to the collectors, a power supply voltage that varies based on an envelope curve of waveform of a radio frequency input signal. A radio frequency signal amplified by the plurality of the unit transistors 21 is output from a radio frequency signal output port 54 via the collector wiring line 32C.

Next, advantageous effects of the first working example are described. Breakdown of a unit transistor 21 at the time of load change in the state where a high collector voltage is being applied is caused by impact ionization. When the impact ionization causes creation of a large number of electron-hole pairs, a collector current increases. This increase in the collector current invites a further increase in the creation of electron-hole pairs and causes device breakdown due to avalanche amplification.

Impact ionization becomes conspicuous in a region of the collector layer 21C (FIG. 1), where the intensity of electric field is high. The ionization rate caused by impact ionization depends on the temperature of the region where the intensity of electric field is high, and the ionization rate decreases as the temperature increases. The collector current of the unit transistor 21 flows mostly through a region that overlaps the emitter electrode 22E (FIG. 3) in the plan view, and this region becomes a heat generating source. In the semiconductor device according to the first working example, the emitter electrode pitch Le is shorter than about ½ of the cell pitch Lc. That is to say, the heat generating sources in the transistor cell 20 are arranged close to each other. The heat generated in the heat generating source in one of the unit transistors 21 causes the temperature of the heat generating source of the other unit transistor 21 to increase, and thus the temperature of the heat generating source is likely to increase. That is to say, the temperature is likely to increase at the region where most of the collector current flows.

The increase in the collector current causes the temperature to increase, and the ionization rate decreases in the region where the temperature increases. As a result, the avalanche amplification caused by impact ionization is not likely to occur, and the device breakdown is also not likely to occur. This provides the advantageous effect of improving the load change breakdown tolerance.

In the first working example, although the temperature of the heat generating source of the unit transistor 21 is likely to increase, an increase in operation instability that could cause thermal runaway of the unit transistor 21 is less likely to occur, as will be described below.

In order to suppress the thermal runaway, the heat generated at the heat generating source of the unit transistor 21 is dissipated through a heat conduction path that passes the emitter electrode 22E (FIG. 1), the emitter wiring line 31E of the first layer (FIG. 1), the emitter wiring line 32E of the second layer (FIG. 3), and the emitter bump 33E (FIG. 3) and reaches a mounting substrate. Because of this, even in the case where two emitter electrodes 22E in the transistor cell 20 are arranged close to each other, sufficient heat dissipation property for suppressing the thermal runaway is secured. In addition, the addition of the resistive element 31R to the base electrode 22B of the unit transistor 21 also contributes to the suppression of the thermal runaway.

Figure 5:
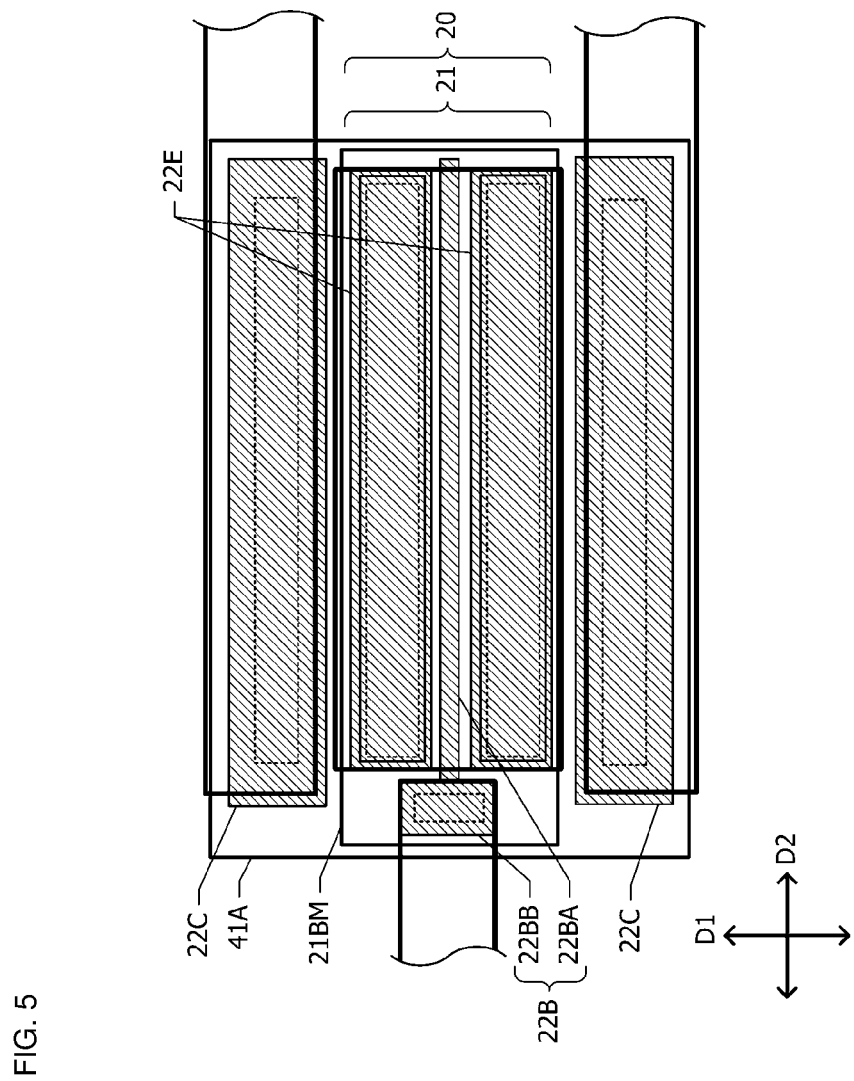
FIG. 5 is a diagram illustrating a spatial relationship in a plan view between a single transistor cell and collector electrodes on both sides thereof in a semiconductor device according to a comparative example.

Next, advantageous effects of the first working example are described compared with a semiconductor device according to a comparative example illustrated in FIG. 5.

FIG. 5 is a diagram illustrating a spatial relationship in the plan view of a single transistor cell 20 and collector electrodes 22C on both sides thereof in a semiconductor device according to a comparative example. In the comparative example illustrated in FIG. 5, each of the transistor cells 20 includes a single unit transistor 21. The unit transistor 21 includes two emitter electrodes 22E arranged with a gap therebetween in the first direction D1. A main part 22BA of a base electrode 22B is arranged between the two emitter electrodes 22E. As is the case with the first working example, the base electrode 22B includes a contact part 22BB. Two collector electrodes 22C are arranged in such a manner as to sandwich the unit transistor 21 in the first direction D1.

With the comparative example, in the case where there is a misalignment between the emitter electrode 22E and the base electrode 22B in the first direction D1 because of the alignment accuracy of fabrication processes, gaps between the main part 22BA of the base electrode 22B and the emitter electrodes 22E on both sides of the main part 22BA differ from each other. That is to say, the symmetry in the first direction D1 is lost. This loss of the symmetry facilitates current concentration at one of the emitter electrodes 22E. Because of this, impact ionization is likely to occur even at a low collector voltage, and the load change breakdown tolerance decreases.

In contrast, in the first working example, among the plurality of the unit transistors 21 (FIG. 3), the order of arrangement of the base electrode 22B and the emitter electrode 22E in the first direction D1 is the same. Because of this, even in the case where there is a misalignment between the emitter electrode 22E and the base electrode 22B in the first direction D1, the gap between the main part 22BA of the base electrode 22B and the emitter electrode 22E is kept substantially constant for all of the plurality of the unit transistors 21. Accordingly, no current concentration occurs at a particular unit transistor 21 because of misalignment. As a result, in the semiconductor device according to the first working example, the advantageous effect of ensuring a sufficiently high load change breakdown tolerance is obtained even in the case where there is a misalignment.

In some cases, a radio frequency signal amplifier circuit has a two-stage configuration including an input stage amplifier and an output stage amplifier. The input stage amplifier does not need to have a high load change breakdown tolerance but is desirable to have a high gain. The output stage amplifier needs to have a high load change breakdown tolerance. It is particularly desirable to apply the semiconductor device according to the first working example to the output stage amplifier.

A technique is known by which HBTs each having characteristics matched with a corresponding need, such as a HBT of the input stage amplifier demanding a high gain and a HBT of the output stage amplifier demanding a high load change breakdown tolerance, are provided using different multilayer structures of semiconductor layers. In the case where this technique is used, two types of HBTs having different multilayer structures of semiconductor layers are formed on a single semiconductor substrate. As a result, the fabrication processes become complicated, and the fabrication cost increases. In contrast, in the first working example, the load change breakdown tolerance is improved by making the spatial relationship among the constituent elements of the semiconductor device in the plan view more preferable. This enables to use a common multilayer structure of semiconductor layers for the HBT of the input stage amplifier and the HBT of the output stage amplifier. As a result, it becomes possible to suppress an increase in fabrication cost.

Figure 6:
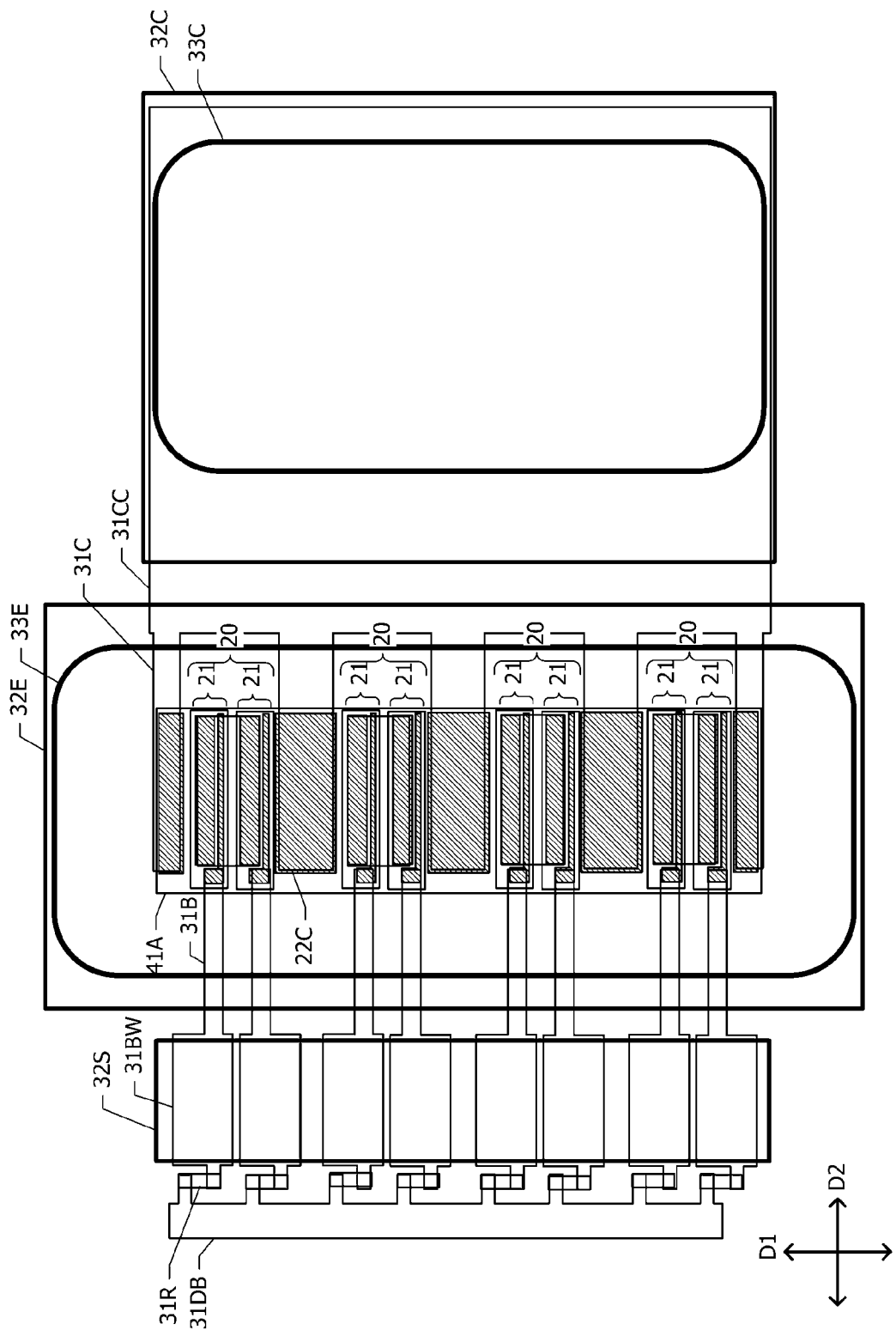
FIG. 6 is a diagram illustrating a spatial relationship in a plan view among constituent elements of a semiconductor device according to a modified example of the first working example.

Next, referring to FIG. 6, a semiconductor device according to a modified example of the first working example is described. FIG. 6 is a diagram illustrating a spatial relationship in a plan view among constituent elements of a semiconductor device according to a modified example of the first working example. In the first working example, two collector electrodes 22C (FIG. 3) are arranged between two adjacent transistor cells 20. Each of the two collector electrodes 22C is electrically connected to the unit transistor 21 of the transistor cell 20 adjacent to the corresponding collector electrode 22C. Furthermore, the sub-collector layer 41A is provided for each of the transistor cell 20.

In contrast, in the modified example illustrated in FIG. 6, four transistor cells 20 are included in a common sub-collector layer 41A in the plan view. A single collector electrode 22C is arranged between two adjacent transistor cells 20. The collector electrode 22C is shared by the transistor cells 20 on both side of the collector electrode 22C and is connected to the collector layers 21C (FIG. 1) of the unit transistors 21 on both sides of the collector electrode 22C.

As in the present modified example, the number of the collector electrodes 22C arranged between the two adjacent transistor cells 20 may be reduced to one, and the collector electrode 22C may be shared by the transistor cells 20 on both sides of the collector electrode 22C.

Second Working Example

Figure 7:
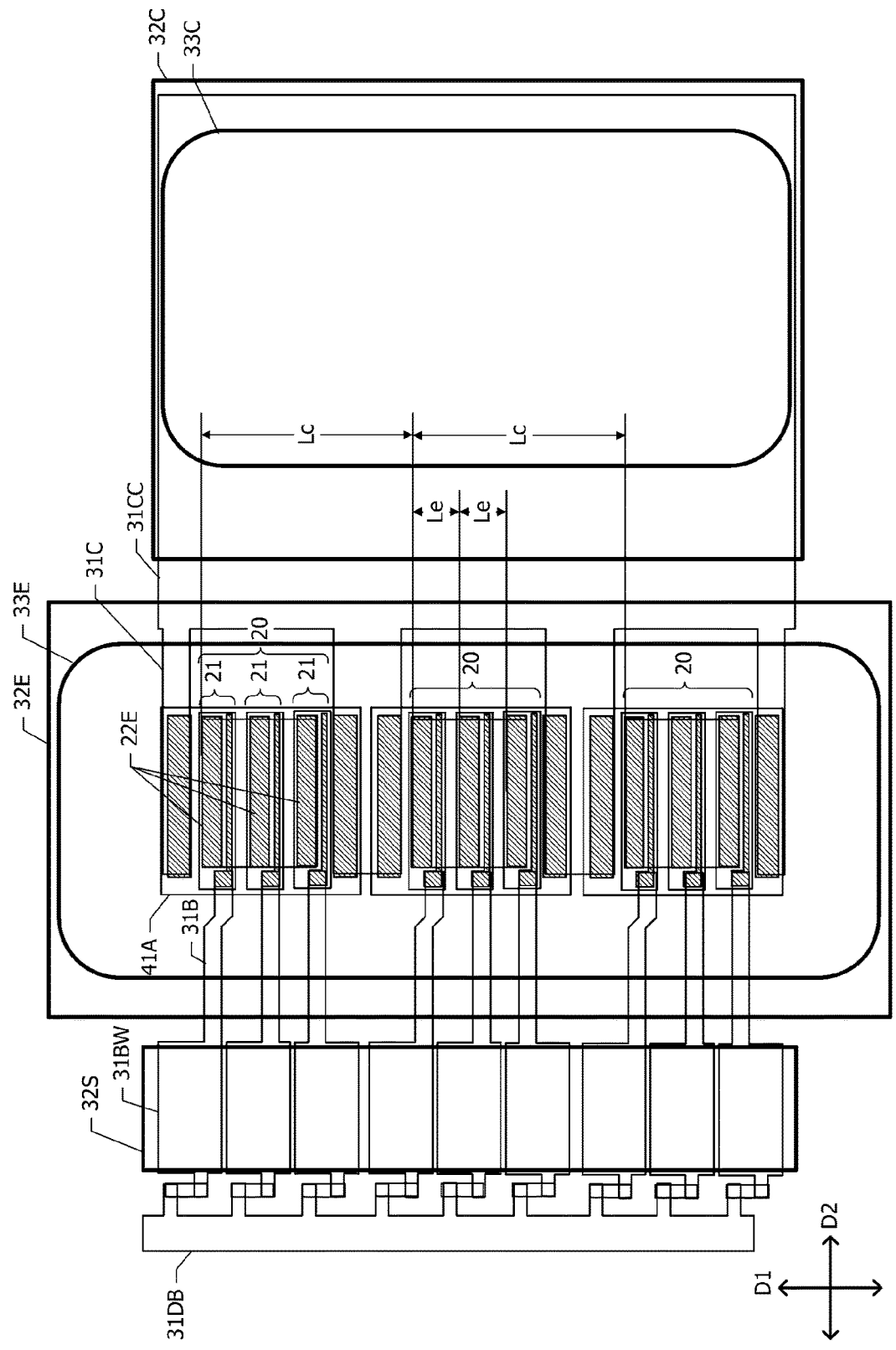
FIG. 7 is a diagram illustrating a planar spatial relationship among constituent elements of a semiconductor device according to a second working example.
Figure 8:
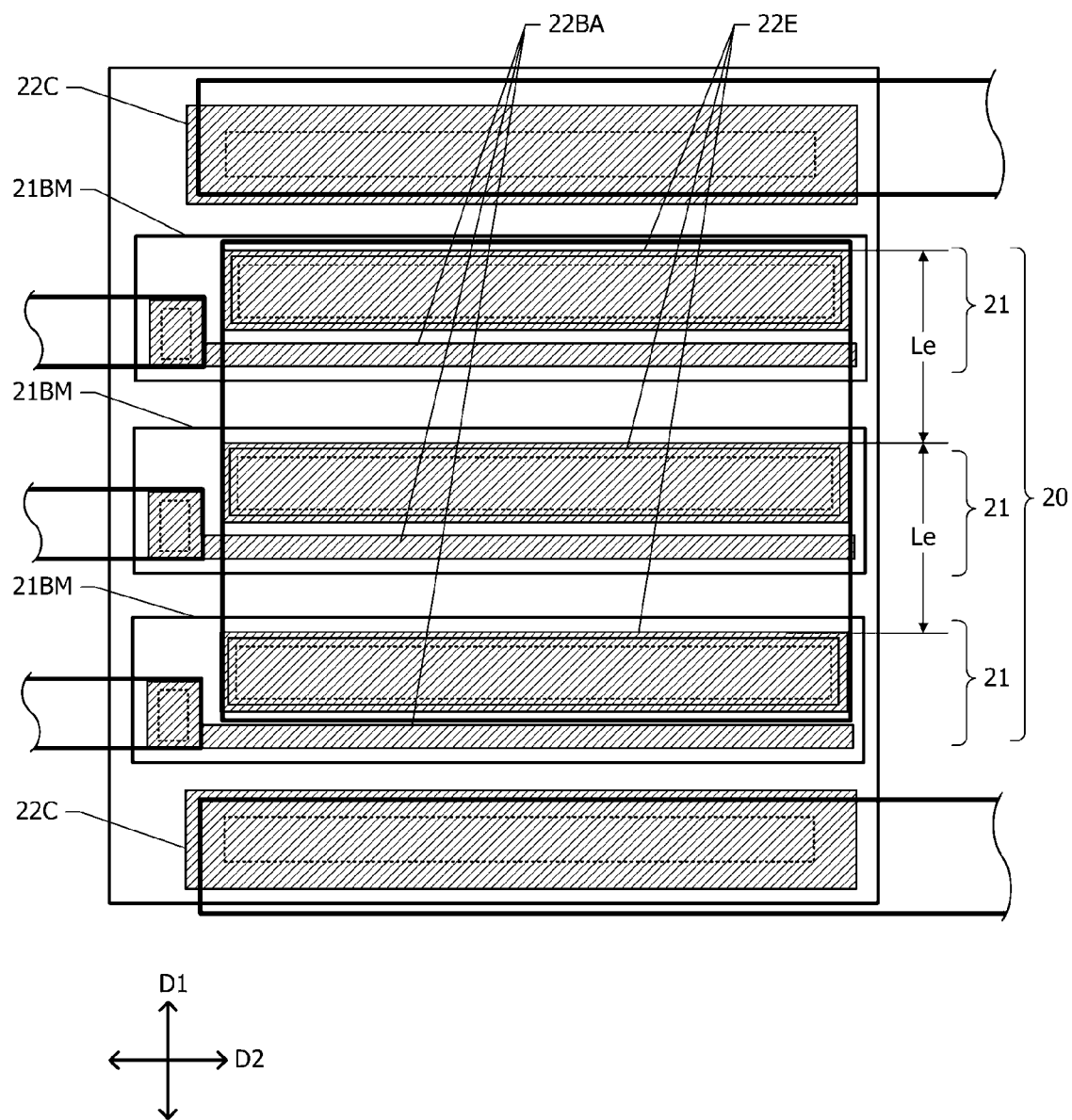
FIG. 8 is a diagram illustrating a planar spatial relationship among constituent elements of a single transistor cell of the semiconductor device according to the second working example.

Next, referring to FIG. 7 and FIG. 8, a semiconductor device according to the second working example is described. Hereinafter, the description regarding the configuration common to the semiconductor device according to the first working example (FIG. 1 to FIG. 4) is omitted.

FIG. 7 is a diagram illustrating a planar spatial relationship among constituent elements of a semiconductor device according to the second working example. FIG. 8 is a diagram illustrating a planar spatial relationship among constituent elements of a single transistor cell 20 of the semiconductor device according to the second working example. As is the case with FIG. 2 and FIG. 3, also in FIG. 7 and FIG. 8, hatching is applied to the emitter electrode 22E, the base electrode 22B, and the collector electrode 22C.

In the first working example, each of a plurality of the transistor cells 20 includes two unit transistors 21. In contrast, in the second working example, each of a plurality of the transistor cells 20 includes three unit transistors 21. These three unit transistors 21 are arranged side by side along the first direction D1 with a substantially constant emitter electrode pitch Le. Furthermore, the plurality of the transistor cells 20 are arranged side by side along the first direction D1 with a substantially constant cell pitch Lc. As is the case with the first working example, also in the second working example, the emitter electrode pitch Le is less than or equal to about ½ of the cell pitch Lc.

Furthermore, as is the case with the first working example, the order of arrangement of the main part 22BA of the base electrode 22B and the emitter electrode 22E in a single unit transistor 21 along the first direction D1 is the same among the plurality of the unit transistors 21.

Next, advantageous effects of the second working example are described. In the second working example, the emitter electrode pitch Le is also less than or equal to about ½ of the cell pitch Lc, and thus, as is the case with the first working example, the advantageous effect of improving the load change breakdown tolerance is obtained. Furthermore, because the order of arrangement of the main part 22BA of the base electrode 22B and the emitter electrode 22E along the first direction D1 is the same among the plurality of the unit transistors 21, it becomes possible to ensure a sufficiently high load change breakdown tolerance even in the case where there is a misalignment.

Figure 9:
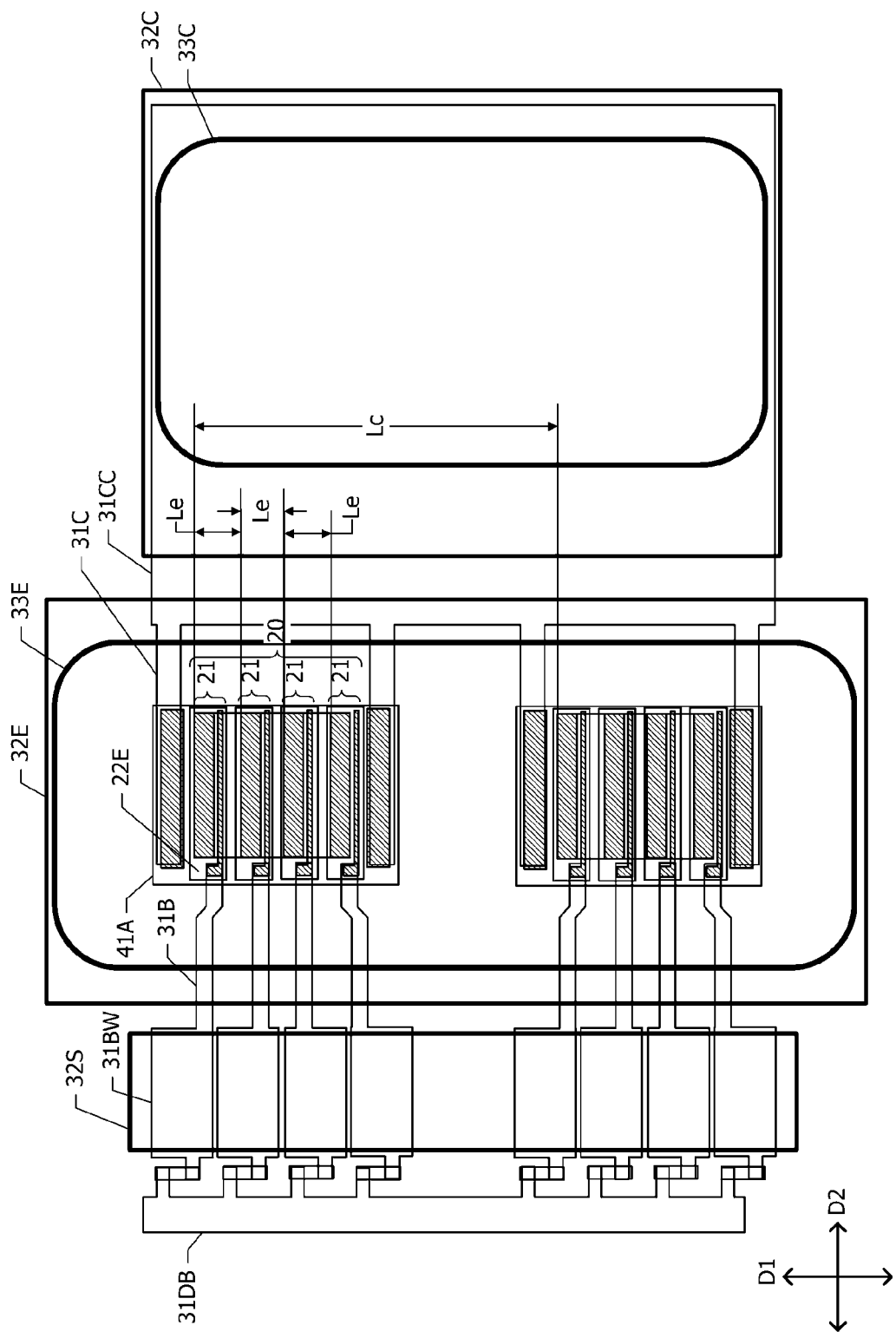
FIG. 9 is a diagram illustrating a planar spatial relationship among constituent elements of a semiconductor device according to a modified example of the second working example.

Next, referring to FIG. 9, a semiconductor device according to a modified example of the second working example is described. FIG. 9 is a diagram illustrating a planar spatial relationship among constituent elements of a semiconductor device according to a modified example of the second working example. As is the case with FIG. 7, also in FIG. 9, hatching is applied to the emitter electrode 22E, the base electrode 22B, and the collector electrode 22C.

In the second working example, a single transistor cell 20 includes three unit transistors 21 (FIG. 7 and FIG. 8). However, in the present modified example, a single transistor cell 20 includes four unit transistors 21. In each of a plurality of the transistor cells 20, these four unit transistors 21 are arranged along the first direction D1 with a substantially constant emitter electrode pitch Le. As is the case with the second working example, the emitter electrode pitch Le is less than or equal to about ½ of the cell pitch Lc.

As is the case with the second working example, also in the modified example illustrated in FIG. 9, the advantageous effect of improving the load change breakdown tolerance is obtained.

Next, another modified example of the second working example is described. The number of the unit transistors 21 included in a single transistor cell 20 is two in the first working example (FIG. 3), three in the second working example (FIG. 7), and four in the modified example (FIG. 9) of the second working example. As another configuration, the number of the unit transistors 21 included in a single transistor cell 20 may be five or more.

Third Working Example

Next, referring to FIG. 10 to FIG. 12D, a semiconductor device according to the third working example is described. Hereinafter, the description regarding the configuration common to the semiconductor device according to the first working example (FIG. 1 to FIG. 4) is omitted.

Figure 10:
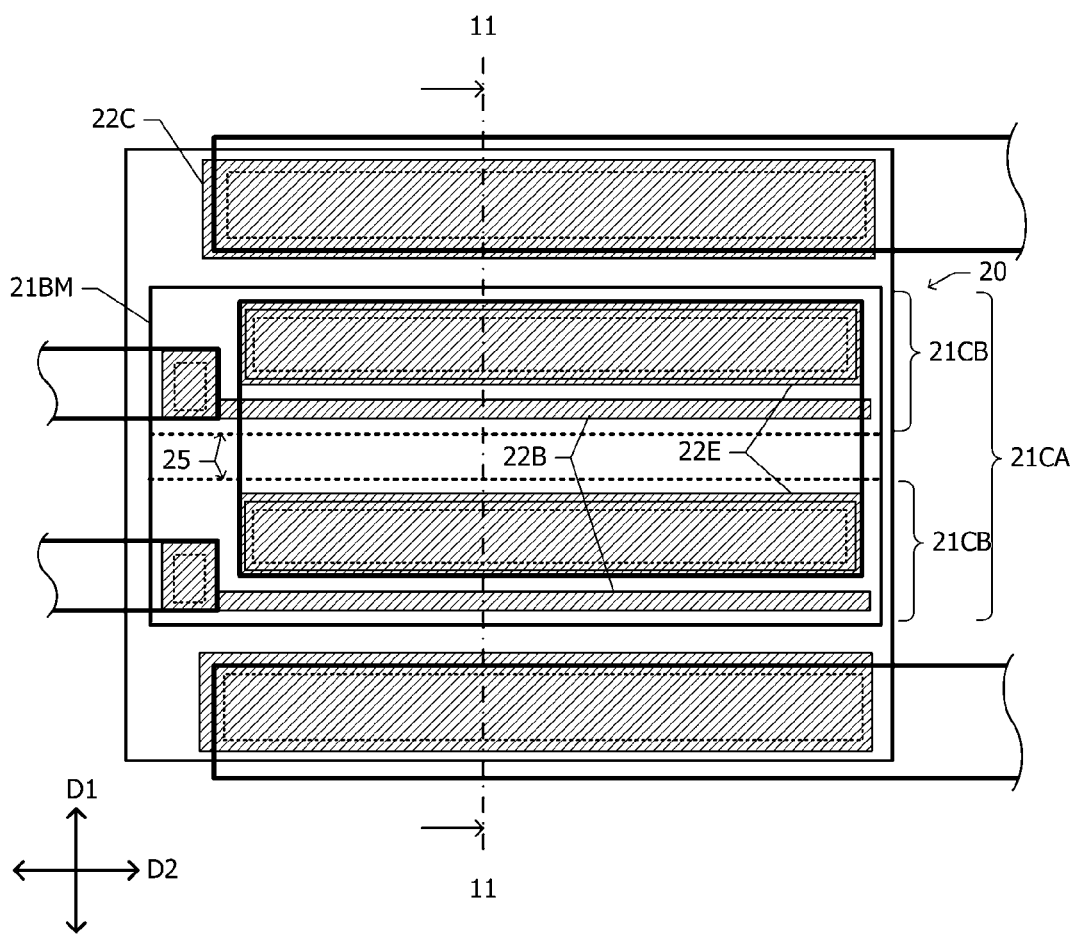
FIG. 10 is a diagram illustrating a planar spatial relationship among constituent elements of a single transistor cell of a semiconductor device according to a third working example.
Figure 11:
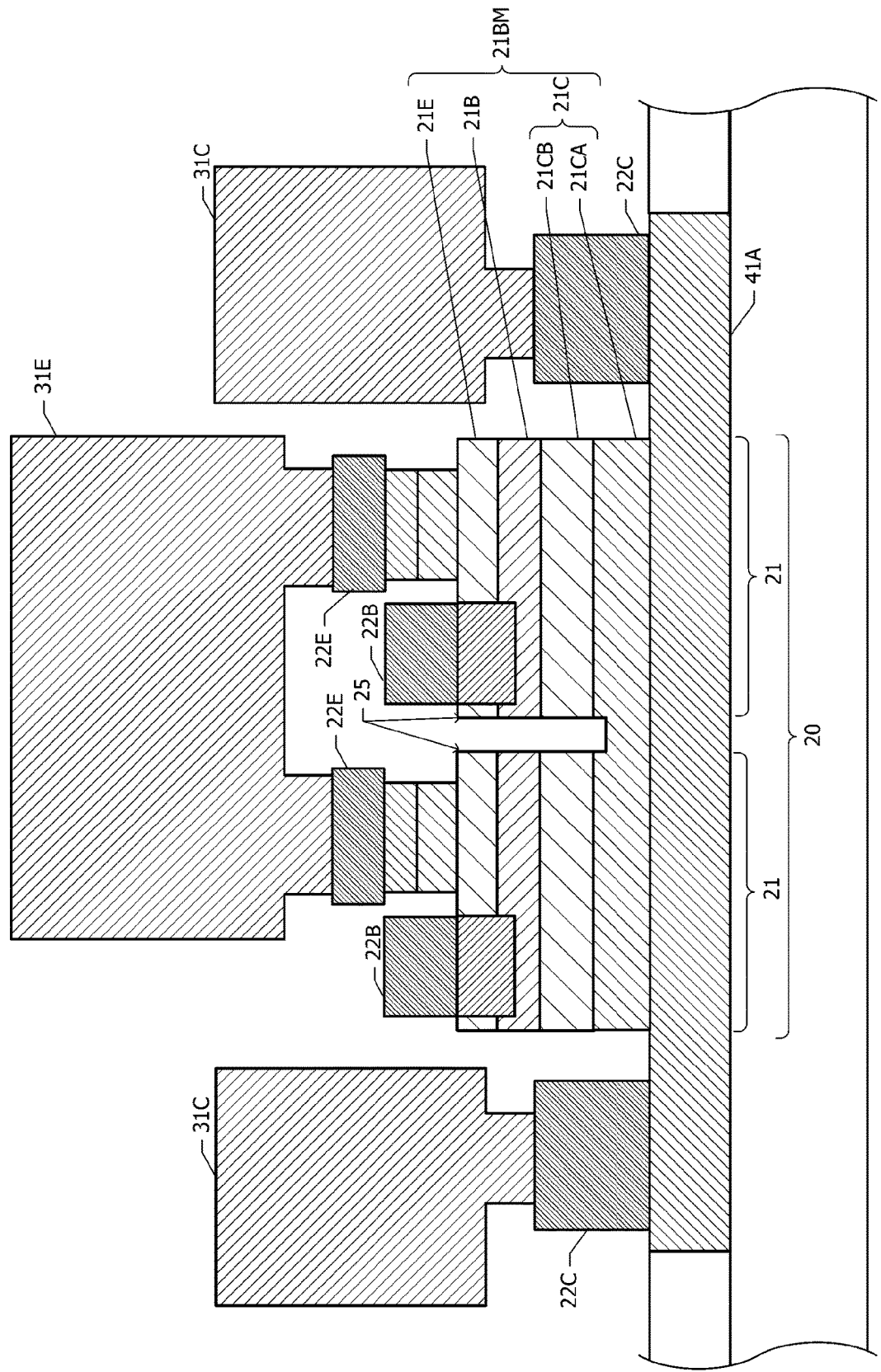
FIG. 11 is a cross-sectional view of FIG. 10 along a dashed-dotted line 11-11.

FIG. 10 is a diagram illustrating a planar spatial relationship among constituent elements of a single transistor cell 20 of a semiconductor device according to the third working example. FIG. 11 is a cross-sectional view of FIG. 10 along the dashed-dotted line 11-11. As is the case with FIG. 2, also in FIG. 10, hatching is applied to the emitter electrode 22E, the base electrode 22B, and the collector electrode 22C.

In the first working example, a height difference reaching the top surface of the sub-collector layer 41A is formed between the two base mesas 21BM (FIG. 1) in the single transistor cell 20, and the collector layers 21C of the two unit transistors 21 are separated from each other. In contrast, in the third working example, a collector layer 21C is continuous between two unit transistors 21 at a lower layer part.

More specifically, the collector layer 21C includes a high concentration collector layer 21CA on the lower side and a low concentration collector layer 21CB on the high concentration collector layer 21CA. The doping concentration of the low concentration collector layer 21CB is lower than the doping concentration of the high concentration collector layer 21CA. A height difference 25 of the base mesa 21BM reaches the bottom surface of the low concentration collector layer 21CB but does not reach the bottom surface of the high concentration collector layer 21CA. That is to say, the low concentration collector layers 21CB of the two unit transistors 21 are separated from each other but the high concentration collector layer 21CA is continuous therebetween.

The drawings from FIG. 12A to FIG. 12D are each a graph illustrating an example of doping concentration distribution in a depth direction of the collector layer 21C. The horizontal axis represents the depth from the top surface of the base layer 21B in the unit "μm", and the vertical axis represents the doping concentration (dopant concentration) in the unit "cm$^{-3}$".

Figure 12A:
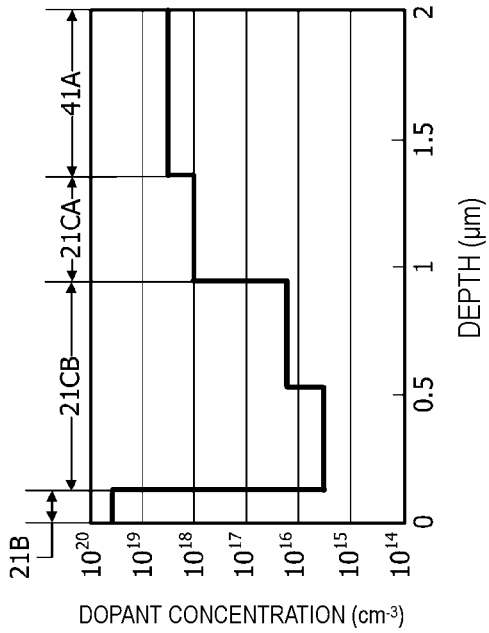
FIG. 12A is a graph illustrating an example of doping concentration (dopant concentration) distribution in a depth direction of a collector layer.

In the example illustrated in FIG. 12A, each of the doping concentrations of the high concentration collector layer 21CA and the low concentration collector layer 21CB is substantially constant along the depth direction, and the doping concentration changes in a stepwise manner at the boundary between the high concentration collector layer 21CA and the low concentration collector layer 21CB. The amount of change in doping concentration at the boundary between the high concentration collector layer 21CA and the low concentration collector layer 21CB is greater than or equal to about an order of magnitude.

Figure 12B:
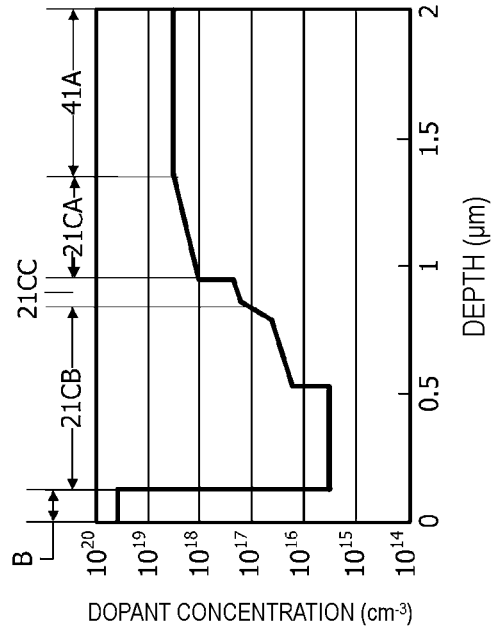
FIG. 12B is a graph illustrating an example of doping concentration (dopant concentration) distribution in the depth direction of the collector layer.

In the example illustrated in FIG. 12B, the low concentration collector layer 21CB includes two layers of different doping concentrations. Of these two layers, the layer closer to the base layer 21B has a lower doping concentration than the layer closer to the high concentration collector layer 21CA. As is the case with the example illustrated in FIG. 12A, also in this case, the doping concentration changes at the boundary between the low concentration collector layer 21CB and the high concentration collector layer 21CA in a stepwise manner, and the amount of change in doping concentration is greater than or equal to about an order of magnitude.

Figure 12C:
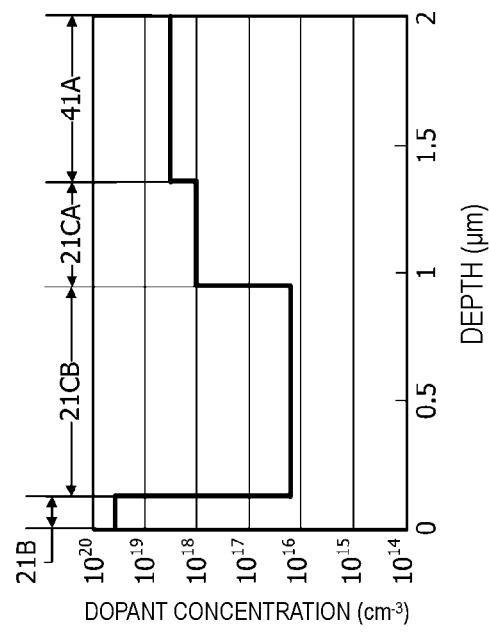
FIG. 12C is a graph illustrating an example of doping concentration (dopant concentration) distribution in the depth direction of the collector layer.

In the example illustrated in FIG. 12C, of the low concentration collector layer 21CB illustrated in FIG. 12B, the doping concentration of the layer closer to the high concentration collector layer 21CA gradually increases toward the high concentration collector layer 21CA from the base layer 21B. In this case, the doping concentration also changes at the boundary between the low concentration collector layer 21CB and the high concentration collector layer 21CA in a stepwise manner, and the amount of change in doping concentration is greater than or equal to about an order of magnitude.

Figure 12D:
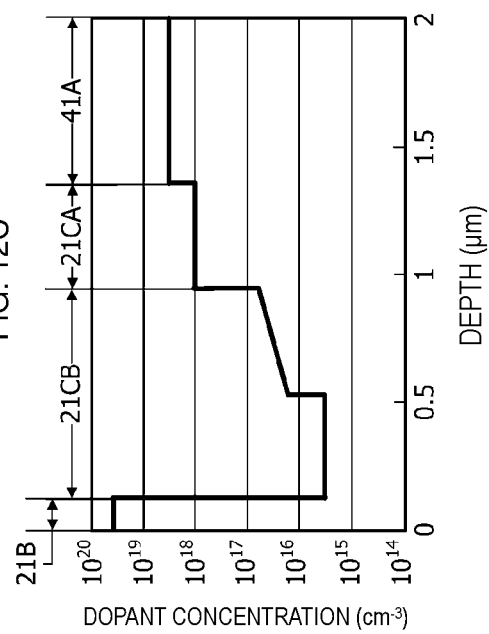
FIG. 12D is a graph illustrating an example of doping concentration (dopant concentration) distribution in the depth direction of the collector layer.

In the example illustrated in FIG. 12D, a middle concentration collector layer 21CC is arranged between the low concentration collector layer 21CB and the high concentration collector layer 21CA, and the doping concentration of the middle concentration collector layer 21CC is between the doping concentration of the low concentration collector layer 21CB and the doping concentration of the high concentration collector layer 21CA. In the depth direction, the doping concentration gradually increases toward the high concentration collector layer 21CA from a middle position of the low concentration collector layer 21CB. In the high concentration collector layer 21CA, the doping concentration also gradually increases toward the sub-collector layer 41A from the middle concentration collector layer 21CC.

Although the doping concentration changes at the boundary between the high concentration collector layer 21CA and the middle concentration collector layer 21CC in a stepwise manner, the amount of change in doping concentration is less than about an order of magnitude. The low concentration collector layer 21CB is defined as a layer whose doping concentration is in a range that is at least an order of magnitude lower than about the minimum value of the doping concentration of the high concentration collector layer 21CA. In the example illustrated in FIG. 12D, the minimum value of the doping concentration of the high concentration collector layer 21CA is about $1\times10^{18}$ cm$^{-3}$, and thus a range of the doping concentration that is less than or equal to about $1\times10^{17}$ cm$^{-3}$ corresponds to the low concentration collector layer 21CB.

The following is a reason why the load change breakdown tolerance can be improved as is the case with the first working example even with the structure in which the high concentration collector layer 21CA is continuous between the two unit transistors 21.

A base-collector voltage is mostly applied to the low concentration collector layer 21CB, and no large voltage is applied to the high concentration collector layer 21CA. That is to say, the electric field is likely to concentrate in the low concentration collector layer 21CB. Because of this, in a high collector voltage state, impact ionization occurs mostly in the low concentration collector layer 21CB, and almost no impact ionization occurs in the high concentration collector layer 21CA. This causes the creation of a large number of electron-hole pairs mostly in the low concentration collector layer 21CB.

Operation will be described in a case where the low concentration collector layer 21CB is continuous between the two unit transistors 21, a relatively large collector current flows into one of the two unit transistors 21, and a relatively large number of electron-hole pairs is created in the low concentration collector layer 21CB. A relatively large number of holes flows into the base layer 21B of the unit transistor 21 in which a relatively large number of electron-hole pairs is created. This flow causes to help a base current to decrease.

When the base current decreases, the amount of voltage drop caused by the resistive element 31R (FIG. 4) decreases, and the base voltage increases. As the base voltage increases, the collector current increases. An increase in the collector current promotes impact ionization. Because of this, a positive feedback operates in such a manner as to further increase the collector current of the unit transistor 21 into which a relatively large collector current flows.

In the unit transistor 21 into which a relatively large collector current flows, in response to the amount of increase in the collector current, a collector potential decreases by the amount of voltage drop caused by a collector resistance. Because of this, the collector potential of the unit transistor 21 into which a relatively small collector current flows increases relatively. Because the resistance value of the low concentration collector layer 21CB is higher than the resistance value of the high concentration collector layer 21CA, this collector potential difference is maintained. Holes created in the low concentration collector layer 21CB of the unit transistor 21 whose collector potential is relatively high are taken by the unit transistor 21 whose collector potential is relatively low. Because of this, the positive feedback described above does not operate in the unit transistor 21 whose collector current is relatively small. This does not increase the collector current of the unit transistor 21 whose collector current is relatively small.

As a result, in the case where there is an imbalance in collector current between two unit transistors 21, there occurs the concentration of the collector current to the unit transistor 21 into which a relatively large collector current flows. This causes the breakdown of one of the unit transistors 21 in which the collector current is concentrated.

In contrast, in the third working example, the low concentration collector layers 21CB are separated from each other between the two unit transistors 21, and thus there is no movement of holes between these two low concentration collector layers 21CB. The two unit transistors 21 operate independently from each other, and this makes the concentration of the collector current difficult to occur in one of the two unit transistors 21. As a result, the advantageous effect of hindering the breakdown of the unit transistor 21 is obtained.

Furthermore, in the third working example, the height difference 25 of the base mesa 21BM (FIG. 11) is smaller compared with the first working example. This enables to bring two base mesas 21BM closer to each other. When the two base mesas 21BM are brought closer to each other, two emitter electrodes 22E also come closer to each other. When the two emitter electrodes 22E are brought closer to each other, there is a significant thermal influence between the two unit transistors 21, and the temperature of the low concentration collector layer 21CB is likely to increase. An increase in temperature of the low concentration collector layer 21CB lowers the ionization rate due to impact ionization, and this enables to further improve the load change breakdown tolerance.

Next, a preferable relationship between the doping concentrations of the low concentration collector layer 21CB and the high concentration collector layer 21CA is described.

In order to prevent the holes created by impact ionization in the collector layer 21C of one of the unit transistors 21 from affecting the other unit transistor 21, it is preferable to suppress the creation of holes due to impact ionization in the high concentration collector layer 21CA that extends continuously from the one of the unit transistors 21 to the other unit transistor 21. To do that, it is preferable to set the doping concentrations in such a way that the electric field concentrates mostly in the low concentration collector layer 21CB and virtually no electric field is applied to the high concentration collector layer 21CA. By setting the doping concentration of the low concentration collector layer 21CB to a value less than or equal to about $1/10$ of the minimum value of the doping concentration in the high concentration collector layer 21CA, it becomes possible to generate a concentrated electric field in the low concentration collector layer 21CB.

Figure 13:
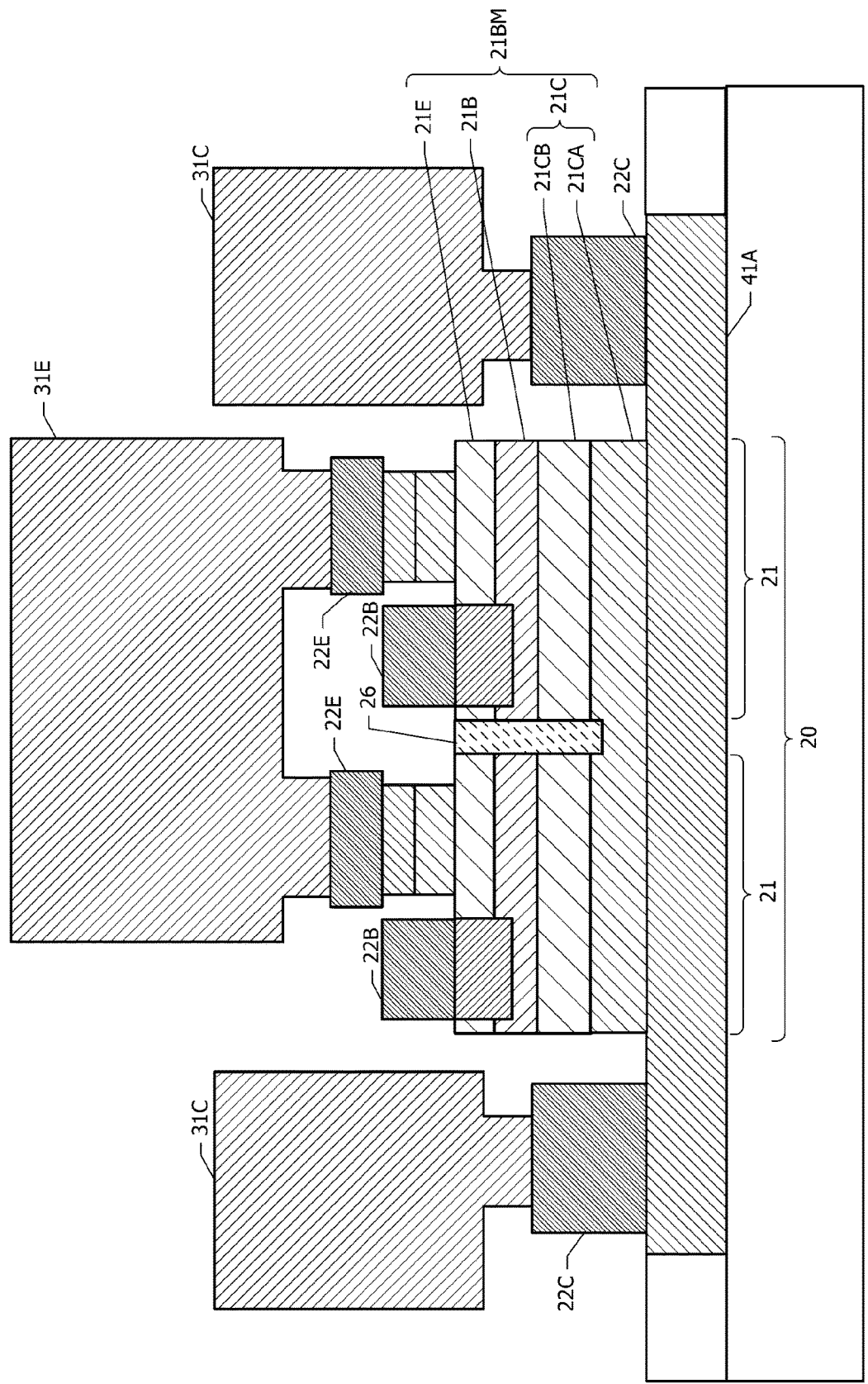
FIG. 13 is a cross-sectional view of a semiconductor device according to a modified example of the third working example.

Next, referring to FIG. 13, a semiconductor device according to a modified example of the third working example is described. FIG. 13 is a cross-sectional view of a semiconductor device according to a modified example of the third working example. In the third working example, the height difference 25 provided in the base mesa 21BM (FIG. 11) separates the low concentration collector layer 21CB, the base layer 21B, and the emitter layer 21E.

In contrast, in the modified example illustrated in FIG. 13, in a single transistor cell 20, each of the emitter layer 21E, the base layer 21B, the low concentration collector layer 21CB, and the high concentration collector layer 21CA is formed of part of a semiconductor layer extending across a plurality of unit transistors 21. Parts of the semiconductor layers in between the emitter layers 21E, in between the base layers 21B, and in between the low concentration collector layers 21CB of the unit transistors 21 adjacent to each other are each insulated by adding an impurity. As an impurity for insulation, B, O, He, or the like may be used. The emitter layers 21E, the base layers 21B, and the low concentration collector layers 21CB of one of the unit transistors 21 adjacent to each other are each electrically isolated from respective counter parts of the other unit transistor 21 by an insulation region 26 that is insulated by adding an impurity.

As in the present modified example, by forming the insulation region 26 instead of the height difference 25, the emitter layer 21E, the base layer 21B, and the low concentration collector layer 21CB may each be electrically insulated at part in between a plurality of the unit transistors 21. Compared with the first working example (FIG. 1), also in the present modified example, it becomes possible to bring two emitter electrodes 22E close to each other.

In the modified example illustrated in FIG. 13, the insulation region 26 reaches an intermediate point of the high concentration collector layer 21CA in the thickness direction but does not reach the sub-collector layer 41A. Alternatively, the insulation region 26 may be configured to reach the boundary between the collector layer 21C and the sub-collector layer 41A. In this case, as is the case with the first working example (FIG. 1), the collector layer 21C may have a configuration in which a low concentration layer and a high concentration layer are not clearly divided.

Fourth Working Example

Figure 14:
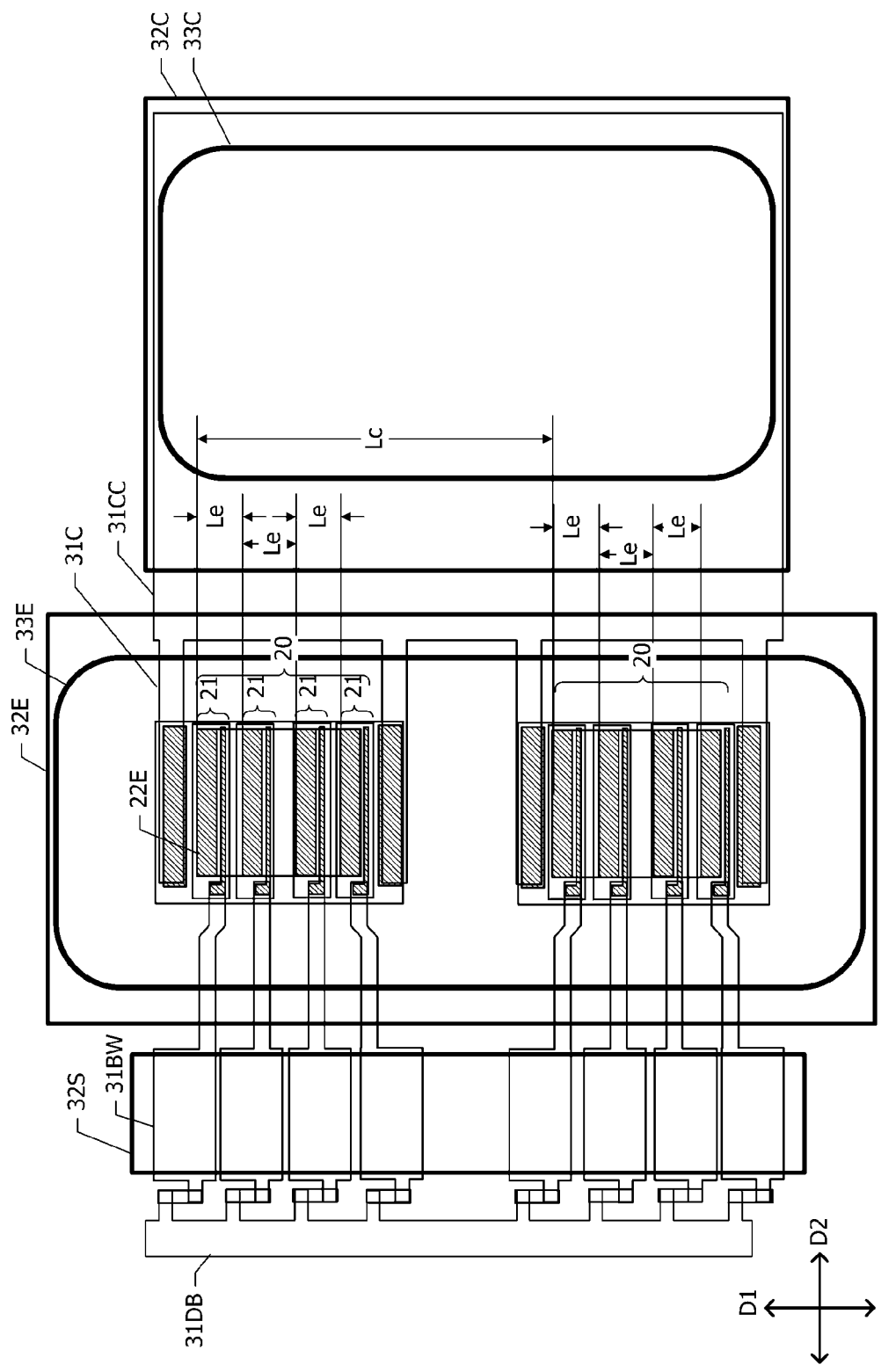
FIG. 14 is a diagram illustrating a spatial relationship in a plan view among constituent elements of a semiconductor device according to a fourth working example.

Next, referring to FIG. 14, a semiconductor device according to the fourth working example is described. Hereinafter, the descriptions regarding the configurations common to the semiconductor devices according to the second working example (FIG. 7 and FIG. 8) and the modified example of the second working example (FIG. 9) are omitted.

FIG. 14 is a diagram illustrating a spatial relationship in a plan view among constituent elements of a semiconductor device according to the fourth working example. As is the case with FIG. 2, also in FIG. 14, hatching is applied to the emitter electrode 22E, the base electrode 22B, and the collector electrode 22C. In the second working example (FIG. 7 and FIG. 8) and the modified example thereof (FIG. 9), the emitter electrode pitch Le is substantially constant in each of the transistor cells 20. In contrast, in the fourth working example, the emitter electrode pitch Le is not constant and varies in each of the transistor cells 20.

For example, in FIG. 14, each of two transistor cells 20 includes four unit transistors 21. Of the four unit transistors 21, the emitter electrode pitch Le between two unit transistors 21 in the inner side is longer than the emitter electrode pitch Le between each of the unit transistors 21 at both ends and the unit transistor 21 adjacent thereto.

When looking at one of the transistor cells 20, the maximum value of the emitter electrode pitches Le for a plurality of the emitter electrodes 22E in the transistor cell 20 being looked at is less than or equal to about $1/2$ of the cell pitch Lc between the transistor cell 20 being looked at and the transistor cell 20 adjacent thereto.

Next, advantageous effects of the fourth working example are described. As is the case with the second working example and the modified example thereof, also in the fourth working example, there is a sufficient thermal influence among a plurality of the unit transistors 21 in the transistor cell 20, and this increases the temperature of the collector layer 21C. This enables to lower the ionization rate caused by impact ionization and improve the load change breakdown tolerance.

Furthermore, it becomes possible to make the thermal influence close to equal among the plurality of the unit transistors 21 by varying the emitter electrode pitch Le in a single transistor cell 20. For example, in FIG. 14, of the four unit transistors 21, the two unit transistors 21 in the inner side receive thermal influences from the unit transistors 21 on both sides. In contrast, each of the unit transistors 21 at both ends receives a thermal influence only from the unit transistor 21 arranged on one side. By making the emitter electrode pitch Le between two unit transistors 21 in the inner side longer than the other emitter electrode pitches Le, it becomes possible to alleviate the thermal influence received at the two unit transistors 21 in the inner side and achieve the leveling of thermal influences received at four unit transistors 21.

Next, a modified example of the fourth working example is described. In the fourth working example, the emitter electrode pitch Le between two unit transistors 21 in the inner side of the four unit transistors 21 is made relatively longer. A plurality of the emitter electrode pitches Le may be set to suitable values depending on an expected temperature distribution during operation.

Fifth Working Example

Figure 15:
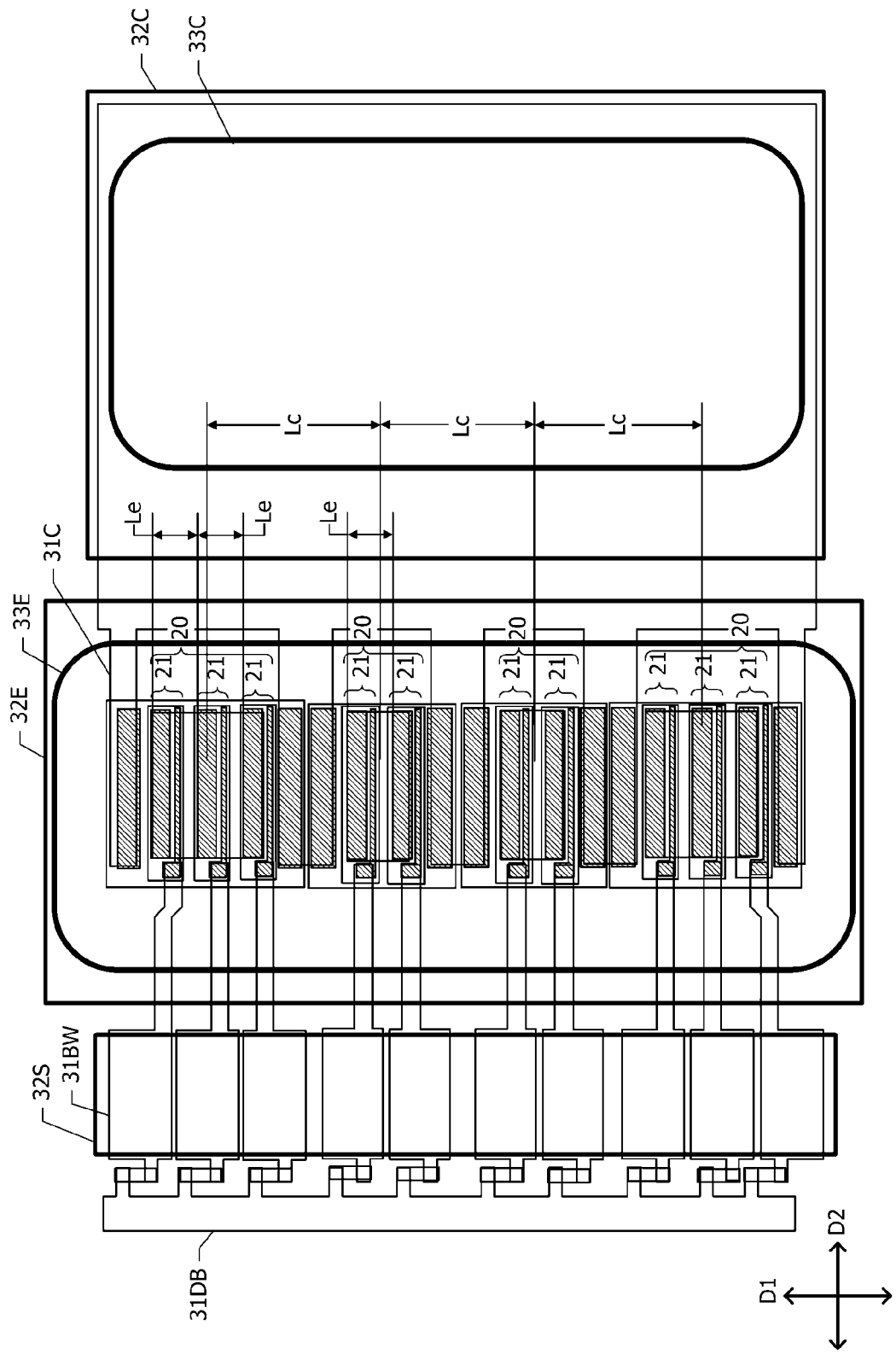
FIG. 15 is a diagram illustrating a spatial relationship in a plan view among constituent elements of a semiconductor device according to a fifth working example.

Next, referring to FIG. 15, a semiconductor device according to the fifth working example is described. Hereinafter, the description regarding the configuration common to the semiconductor device according to the first working example (FIG. 1 to FIG. 4) is omitted.

FIG. 15 is a diagram illustrating a spatial relationship in a plan view among constituent elements of a semiconductor device according to the fifth working example. As is the case with FIG. 2, also in FIG. 15, hatching is applied to the emitter electrode 22E, the base electrode 22B, and the collector electrode 22C. In the first working example, the number of the unit transistors 21 included in each of a plurality of the transistor cells 20 is the same for all the transistor cells 20. In contrast, in the fifth working example, the number of the unit transistors 21 included in each of a plurality of the transistor cells 20 varies among the plurality of the transistor cells 20. For example, in the working example illustrated in FIG. 15, four transistor cells 20 are arranged side by side along the first direction D1. Each of two transistor cells 20 in the inner side includes two unit transistors 21, and each of two transistor cells 20 at both ends includes three unit transistors 21.

As a reference point for measuring the cell pitch Lc between the two transistor cells 20 adjacent to each other, a geometric center of a plurality of emitter electrodes 22E included in the transistor cell 20 in the plan view may be employed.

Next, advantageous effects of the fifth working example are described. As is the case with the first working example, also in the fifth working example, it becomes possible to improve the load change breakdown tolerance by making the emitter electrode pitch Le shorter than about ½ of the cell pitch Lc.

Next, a modified example of the fifth working example is described. In the fifth working example, the transistor cell 20 including two unit transistors 21 and the transistor cell 20 including three unit transistors 21 are mixed. A transistor cell 20 including four or more unit transistors 21 may be further mixed.

Sixth Working Example

Figure 16:
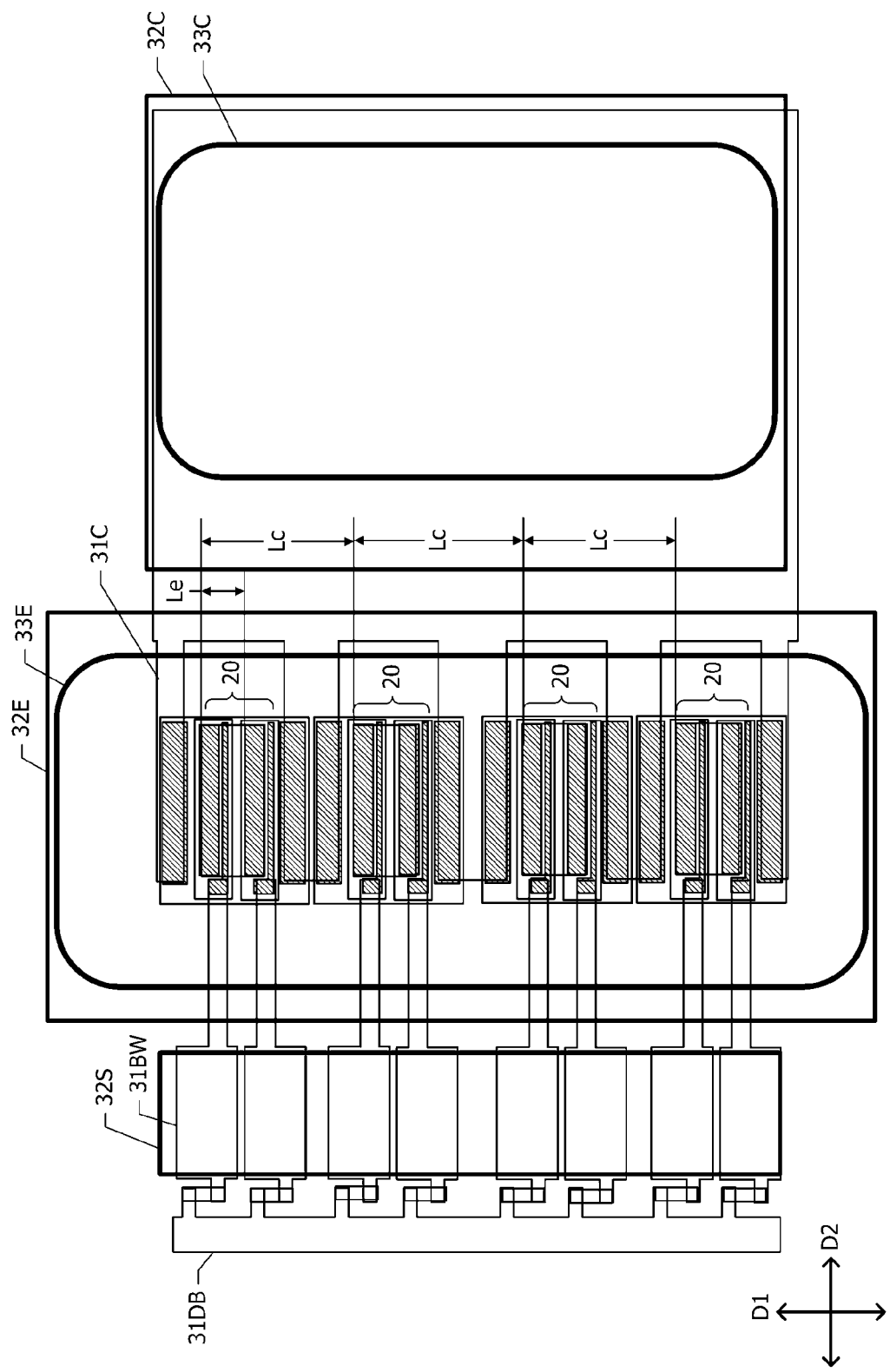
FIG. 16 is a diagram illustrating a spatial relationship in a plan view among constituent elements of a semiconductor device according to a sixth working example.

Next, referring to FIG. 16, a semiconductor device according to the sixth working example is described. Hereinafter, the description regarding the configuration common to the semiconductor device according to the first working example (FIG. 1 to FIG. 4) is omitted.

FIG. 16 is a diagram illustrating a spatial relationship in a plan view among constituent elements of a semiconductor device according to the sixth working example. As is the case with FIG. 2, also in FIG. 16, hatching is applied to the emitter electrode 22E, the base electrode 22B, and the collector electrode 22C. In the first working example (FIG. 3), the cell pitch Lc is substantially the same for all of combinations of two transistor cells 20 adjacent to each other. In contrast, in the sixth working example, the cell pitch Lc varies. In the sixth working example illustrated in FIG. 16, four transistor cells 20 are arranged side by side along the first direction D1. The cell pitch Lc between the two transistor cell 20 in the inner side is longer than the cell pitch Lc between each of the transistor cells 20 at both ends and the transistor cell 20 adjacent thereto.

When looking at one of the transistor cells 20, the emitter electrode pitch Le of the two unit transistors 21 of the transistor cell 20 being looked at is shorter than about ½ of the cell pitch Lc which is the shorter one of the cell pitches Lc between the transistor cell 20 being looked at and the transistor cells 20 adjacent thereto.

Next, advantageous effects of the sixth working example are described. As is the case with the first working example, also in the sixth working example, it becomes possible to improve the load change breakdown tolerance. Furthermore, it becomes possible to achieve the leveling of temperature during operation by making the cell pitch Lc relatively longer at a location where the temperature is likely to increase during operation. This enables to hinder the device breakdown due to the thermal runaway.

Seventh Working Example

Figure 17:
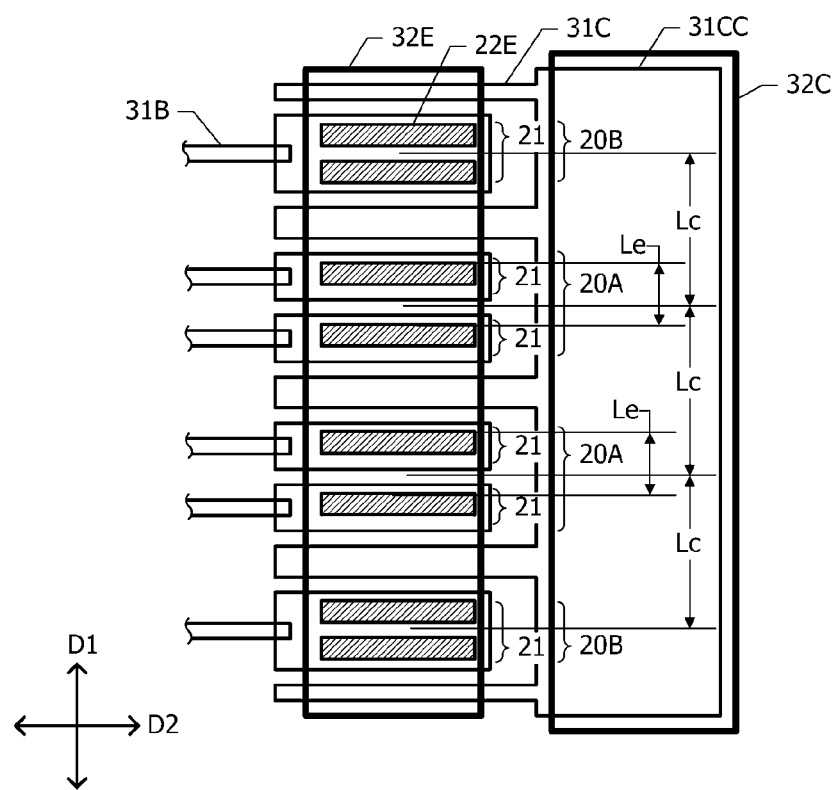
FIG. 17 is a diagram schematically illustrating a spatial relationship in a plan view among constituent elements of a semiconductor device according to a seventh working example.

Next, referring to FIG. 17, a semiconductor device according to the seventh working example is described. Hereinafter, the description regarding the configuration common to the semiconductor device according to the first working example (FIG. 1 to FIG. 4) is omitted.

FIG. 17 is a diagram schematically illustrating a spatial relationship in a plan view among constituent elements of a semiconductor device according to the seventh working example. In FIG. 17, the base electrode and the collector electrode are not illustrated, and hatching is applied to the emitter electrode 22E. In the first working example (FIG. 3), every transistor cell 20 includes two unit transistors 21 illustrated in FIG. 2. In contrast, in the seventh working example, two types of transistor cells 20 in which the spatial relationships of the emitter electrode 22E and the base electrode 22B are different in the plan view are mixed.

The transistor cell 20 of one type (hereinafter, referred to as "first transistor cell 20A") includes two unit transistors 21 illustrated in FIG. 2 as is the case with the first working example. The transistor cell 20 of the other type (hereinafter, referred to as "second transistor cell 20B") includes a unit transistor 21 according to the comparative example illustrated in FIG. 5. The four transistor cells 20 are arranged side by side along the first direction D1, the second transistor cells 20B are arranged at both ends, and two first transistor cells 20A are arranged in the inner side. In the first transistor cell 20A, a base wiring line 31B is extended from each of two unit transistors 21. In the second transistor cell 20B, a single base wiring line 31B is extended from a single unit transistor 21.

As a reference point for measuring the cell pitch Lc between the two first transistor cells 20A, the cell pitch Lc between the two second transistor cells 20B, the cell pitch Lc between the first transistor cell 20A and the second transistor cell 20B, a geometric center of a plurality of emitter electrodes 22E included in the first transistor cell 20A or the second transistor cell 20B in the plan view may be employed. The emitter electrode pitch Le of the two unit transistors 21 in the first transistor cell 20A is shorter than about ½ of the cell pitch Lc which is the shorter one of the cell pitches Lc between the first transistor cell 20A and the first transistor cell 20A or the second transistor cell 20B adjacent thereto.

Next, advantageous effects of the seventh working example are described. In the first transistor cell 20A of a semiconductor device according to the seventh working example, it becomes possible to improve the load change breakdown tolerance as is the case with the first working example. In a semiconductor device including a plurality of transistor cells 20, there is a case where a certain transistor cell 20 is likely to break down due to load change. In such a case, the transistor cell 20 that is likely to break down due to load change may be the first transistor cell 20A, and the rest of transistor cells 20 may be the second transistor cell 20B.

Figure 18:
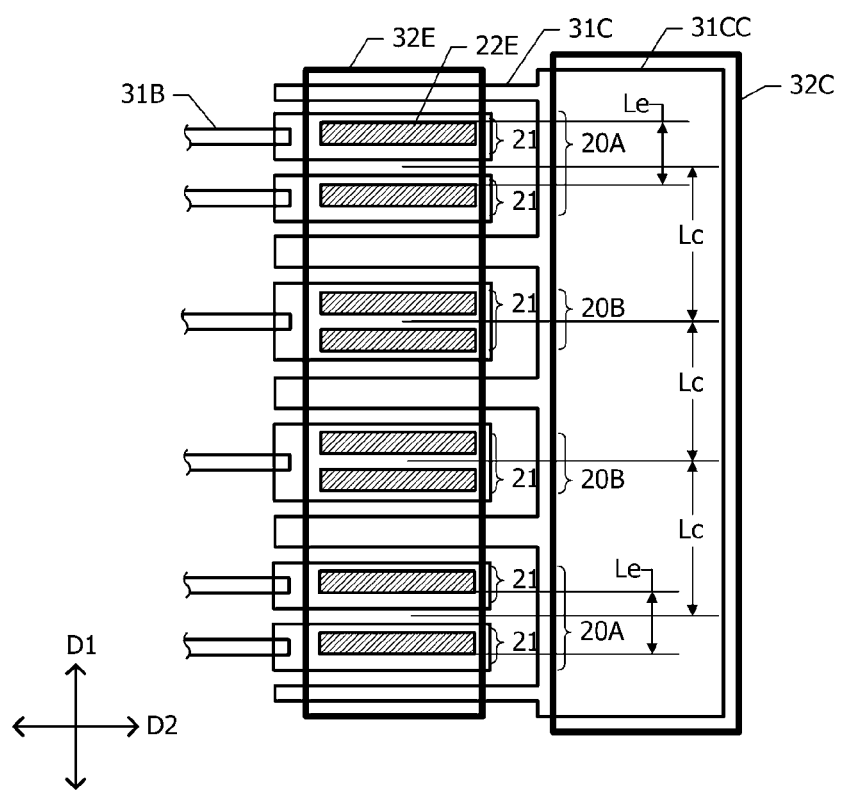
FIG. 18 is a diagram schematically illustrating a spatial relationship in a plan view among constituent elements of a semiconductor device according to a modified example of the seventh working example.

Next, referring to FIG. 18, a modified example of the seventh working example is described. FIG. 18 is a diagram schematically illustrating a spatial relationship in a plan view among constituent elements of a semiconductor device according to the modified example of the seventh working example. In the seventh working example (FIG. 17), the second transistor cells 20B are arranged at both ends in the first direction D1, and the two first transistor cells 20A are arranged in the inner side. In contrast, in the present modified example, the arrangement is reversed. The first transistor cells 20A are arranged at both ends in the first direction D1, and the two second transistor cells 20B are arranged in the inner side.

In general, in the case where a plurality of transistor cells 20 are arranged side by side in one direction, there is a tendency that during operation, the temperatures of unit transistors 21 in the transistor cells 20 at both ends become lower than the temperatures of unit transistors 21 in the transistor cells 20 in the inner side. When the temperature during operation is low, the ionization rate of impact ionization increases, and thus the breakdown due to load change is likely to occur. In the present modified example, the first transistor cell 20A is used as a transistor cell 20 to be arranged at a location where the temperature tends to be relatively low, and this is particularly effective for improving the load change breakdown tolerance.

Note that depending on structures of wiring lines and bumps around the region where a plurality of transistor cells 20 is arranged, the transistor cell 20 in the inner side may likely to break down due to load change in some cases. The first transistor cell 20A may be employed as, of the plurality of transistor cells 20, a transistor cell 20 to be arranged at a location where the breakdown due to load change is likely to occur.

Needless to say, each of the foregoing working examples is for illustrative purposes only, and constituent elements of different working examples may be partially exchanged or combined. Similar functions and effects produced by similar constituent elements of different working examples are not repeated in every working example. Further, the present disclosure is not limited to the foregoing working examples. For example, it would be obvious to a person skilled in the art that various changes, improvements, combinations, or the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a substrate;
a plurality of transistor cells arranged side by side along a first direction on a surface of the substrate, each of the plurality of transistor cells including at least one unit transistor; and
a collector electrode arranged between two of the plurality of transistor cells adjacent to one another, wherein
a first transistor cell of the plurality of transistor cells includes a plurality of unit transistors arranged side by side along the first direction, at least one of the plurality of transistor cells being the first transistor cell,
the plurality of unit transistors are connected in parallel to one another,
each of the plurality of unit transistors includes a collector layer, a base layer arranged on the collector layer, an emitter layer arranged on the base layer, a base electrode electrically connected to the base layer, and an emitter electrode electrically connected to the emitter layer,
the collector electrode is electrically connected to the collector layer of the unit transistor included in the transistor cell adjacent to the collector electrode in the first direction, and
in the first transistor cell,
the base electrode and the emitter electrode in each of the plurality of unit transistors are arranged side by side along the first direction, and an order of arrangement of the base electrode and the emitter electrode is same among the plurality of unit transistors, and
when looking at one of the first transistor cells, a maximum value of emitter electrode pitches is shorter than ½ of a shorter cell pitch, the emitter electrode pitch being a distance in the first direction between the emitter electrodes of two unit transistors adjacent to one another in the first transistor cell being looked at, the shorter cell pitch being a shorter one of cell pitches that are specific distances in the first direction between the transistor cell being looked at and the transistor cells adjacent to the transistor cell being looked at.

2. The semiconductor device according to claim 1, wherein
in the first transistor cell, a gap between the emitter electrode and the base electrode in the first direction in each of the plurality of unit transistors is same among the plurality of unit transistors.

3. The semiconductor device according to claim 1, wherein a number of the unit transistors included in each of the plurality of transistor cells is same,
the emitter electrode pitch is constant in all of combinations of two emitter electrodes adjacent to one another in the plurality of transistor cells, and
the cell pitch is constant for the plurality of transistor cells.

4. The semiconductor device according to claim 1, wherein
the emitter layer and the base layer of each of the plurality of unit transistors are separated from the emitter layer and the base layer of another unit transistor in a plan view.

5. The semiconductor device according to claim 4, wherein
the collector layer of each of the plurality of unit transistors is separated from the collector layer of another unit transistor in the plan view.

6. The semiconductor device according to claim 4, wherein
the collector layer of each of the plurality of unit transistors includes a low concentration collector layer and a high concentration collector layer,
the low concentration collector layer is arranged between the high concentration collector layer and the base layer,
a doping concentration of the low concentration collector layer is less than or equal to $1/10$ of a doping concentration of the high concentration collector layer, and
the low concentration collector layer is separated from the low concentration collector layer of another unit transistor in the plan view.

7. The semiconductor device according to claim 4, wherein
the emitter layer and the base layer of each of the plurality of unit transistors are separated from the emitter layer and the base layer of another unit transistor in the plan view by a height difference extending from an edge part of the emitter layer and the base layer toward the substrate.

8. The semiconductor device according to claim 4, wherein
each of the emitter layer and the base layer of each of the plurality of unit transistors is part of a semiconductor layer arranged in such a manner as to extend across the plurality of unit transistors, and
parts of the semiconductor layers in between the emitter layers and in between the base layers of the unit transistors adjacent to one another are insulated by adding an impurity.

9. The semiconductor device according to claim 1, further comprising:
a radio frequency signal input wiring line provided on the substrate, to which a radio frequency signal is supplied;
a DC bias input wiring line provided on the substrate, to which a DC bias is supplied; and
a capacitive element and a resistive element arranged for each of the base electrodes of the plurality of unit transistors, wherein
the capacitive element connects a corresponding base electrode to the radio frequency signal input wiring line, and
the resistive element connects a corresponding base electrode to the DC bias input wiring line.

10. The semiconductor device according to claim 1, wherein
a spatial relationship between the emitter electrode and the base electrode of a unit transistor included in a second transistor cell of the plurality of transistor cells in a plan view is different from a spatial relationship between the emitter electrode and the base electrode of a unit transistor included in the first transistor cell in a plan view, one or more of the plurality of transistor cells that are different from the first transistor cell being the second transistor cell.

11. The semiconductor device according to claim 2, wherein
a number of the unit transistors included in each of the plurality of transistor cells is same,
the emitter electrode pitch is constant in all of combinations of two emitter electrodes adjacent to one another in the plurality of transistor cells, and
the cell pitch is constant for the plurality of transistor cells.

12. The semiconductor device according to claim 2, wherein
the emitter layer and the base layer of each of the plurality of unit transistors are separated from the emitter layer and the base layer of another unit transistor in a plan view.

13. The semiconductor device according to claim 3, wherein
the emitter layer and the base layer of each of the plurality of unit transistors are separated from the emitter layer and the base layer of another unit transistor in a plan view.

14. The semiconductor device according to claim 5, wherein
the emitter layer and the base layer of each of the plurality of unit transistors are separated from the emitter layer and the base layer of another unit transistor in the plan view by a height difference extending from an edge part of the emitter layer and the base layer toward the substrate.

15. The semiconductor device according to claim 6, wherein
the emitter layer and the base layer of each of the plurality of unit transistors are separated from the emitter layer and the base layer of another unit transistor in the plan view by a height difference extending from an edge part of the emitter layer and the base layer toward the substrate.

16. The semiconductor device according to claim 5, wherein
each of the emitter layer and the base layer of each of the plurality of unit transistors is part of a semiconductor layer arranged in such a manner as to extend across the plurality of unit transistors, and
parts of the semiconductor layers in between the emitter layers and in between the base layers of the unit transistors adjacent to one another are insulated by adding an impurity.

17. The semiconductor device according to claim 6, wherein
each of the emitter layer and the base layer of each of the plurality of unit transistors is part of a semiconductor layer arranged in such a manner as to extend across the plurality of unit transistors, and
parts of the semiconductor layers in between the emitter layers and in between the base layers of the unit transistors adjacent to one another are insulated by adding an impurity.

18. The semiconductor device according to claim 2, further comprising:
- a radio frequency signal input wiring line provided on the substrate, to which a radio frequency signal is supplied;
- a DC bias input wiring line provided on the substrate, to which a DC bias is supplied; and
- a capacitive element and a resistive element arranged for each of the base electrodes of the plurality of unit transistors, wherein
- the capacitive element connects a corresponding base electrode to the radio frequency signal input wiring line, and
- the resistive element connects a corresponding base electrode to the DC bias input wiring line.

19. The semiconductor device according to claim 3, further comprising:
- a radio frequency signal input wiring line provided on the substrate, to which a radio frequency signal is supplied;
- a DC bias input wiring line provided on the substrate, to which a DC bias is supplied; and
- a capacitive element and a resistive element arranged for each of the base electrodes of the plurality of unit transistors, wherein
- the capacitive element connects a corresponding base electrode to the radio frequency signal input wiring line, and
- the resistive element connects a corresponding base electrode to the DC bias input wiring line.

20. The semiconductor device according to claim 2, wherein
- a spatial relationship between the emitter electrode and the base electrode of a unit transistor included in a second transistor cell of the plurality of transistor cells in a plan view is different from a spatial relationship between the emitter electrode and the base electrode of a unit transistor included in the first transistor cell in a plan view, one or more of the plurality of transistor cells that are different from the first transistor cell being the second transistor cell.

* * * * *